United States Patent
Motoya et al.

(10) Patent No.: US 9,785,039 B2
(45) Date of Patent: Oct. 10, 2017

(54) WAVELENGTH CONVERSION MEMBER, LIGHT EMITTING DEVICE, PROJECTOR, AND METHOD OF MANUFACTURING WAVELENGTH CONVERSION MEMBER

(71) Applicant: PANASONIC INTELLECTUAL PROPERTY MANAGEMENT CO., LTD., Osaka (JP)

(72) Inventors: Atsushi Motoya, Shiga (JP); Kenta Watanabe, Osaka (JP); Ran Zheng, Osaka (JP); Sachiko Azuma, Osaka (JP); Yoshihisa Nagasaki, Osaka (JP); Takahiro Hamada, Osaka (JP); Mitsuru Nitta, Osaka (JP); Takashi Maniwa, Osaka (JP); Toshio Mori, Kyoto (JP); Kazuhiro Matsuo, Osaka (JP)

(73) Assignee: PANASONIC INTELLECTUAL PROPERTY MANAGMENT CO., LTD., Osaka (JP)

(*) Notice: Subject to any disclaimer, the term of this patent is extended or adjusted under 35 U.S.C. 154(b) by 209 days.

(21) Appl. No.: 14/832,117

(22) Filed: Aug. 21, 2015

(65) Prior Publication Data

US 2016/0077415 A1 Mar. 17, 2016

(30) Foreign Application Priority Data

Sep. 11, 2014 (JP) .................. 2014-185302
Sep. 11, 2014 (JP) .................. 2014-185329
Sep. 11, 2014 (JP) .................. 2014-185455

(51) Int. Cl.
G03B 21/20 (2006.01)
H01L 33/50 (2010.01)
(Continued)

(52) U.S. Cl.
CPC ......... *G03B 21/204* (2013.01); *G02B 27/141* (2013.01); *G03B 21/2066* (2013.01); *H01S 5/0092* (2013.01); *H01L 2933/0041* (2013.01)

(58) Field of Classification Search
None
See application file for complete search history.

(56) References Cited

U.S. PATENT DOCUMENTS 8,780,438 B2 7/2014 Hamada et al.
8,854,725 B2 10/2014 Hamada et al.
(Continued)

FOREIGN PATENT DOCUMENTS

CN 103717963 4/2014
JP 2012-54272 3/2012
(Continued)

OTHER PUBLICATIONS

Official Action, along with English-language translation thereof, for CN Pat. Appl. No. 201510510691.4 dated Aug. 25, 2016.

*Primary Examiner* — Hemang Sanghavi
(74) *Attorney, Agent, or Firm* — Greenblum & Bernstein, P.L.C.

(57) ABSTRACT

A wavelength conversion member includes a substrate, a dichroic mirror layer, an SiO$_2$ layer, a ZnO layer, and a phosphor layer, which are sequentially stacked from the substrate. The dichroic mirror layer reflects at least part of light incident from the above. The phosphor layer includes a plurality of phosphors and ZnO between the phosphors.

13 Claims, 15 Drawing Sheets

(51) Int. Cl.
*H01S 5/00* (2006.01)
*G02B 27/14* (2006.01)

(56) References Cited

U.S. PATENT DOCUMENTS

| | | |
|---|---|---|
| 2013/0003400 A1 | 1/2013 | Kijima et al. |
| 2013/0099661 A1* | 4/2013 | Gasse .................. H05B 33/10 |
| | | 313/512 |
| 2014/0071683 A1 | 3/2014 | Hamada et al. |
| 2014/0072812 A1 | 3/2014 | Hamada et al. |
| 2014/0153216 A1 | 6/2014 | Yamanaka et al. |
| 2015/0197689 A1* | 7/2015 | Tani .................... C09K 11/025 |
| | | 362/84 |

FOREIGN PATENT DOCUMENTS

| | | |
|---|---|---|
| JP | 2013-12358 | 1/2013 |
| WO | 2013/172025 | 11/2013 |
| WO | 2013/175773 | 11/2013 |

* cited by examiner

WAVELENGTH CONVERSION MEMBER, LIGHT EMITTING DEVICE, PROJECTOR, AND METHOD OF MANUFACTURING WAVELENGTH CONVERSION MEMBER

CROSS REFERENCE TO RELATED APPLICATIONS

The present application is based on and claims priority of Japanese Patent Applications Nos. 2014-185455, 2014-185302, and 2014-185329 all of which were filed on Sep. 11, 2014. The entire disclosures of the above-identified applications, including the specifications, drawings and claims are incorporated herein by reference in its entirety.

BACKGROUND OF THE INVENTION

1. Field of the Invention

The present disclosure relates to a wavelength conversion member including phosphors and the like which are used in projectors and the like.

2. Description of the Related Art

Conventionally, projectors that project image on a screen have been known. Projectors generally perform spatial modulation on light emitted from a light source by using a digital micromirror device, a liquid crystal display element, and the like to eventually project (display) the resulting image.

In recent years, a light source dedicated to projectors, which emits light from a Light Emitting Diode (LED), a semiconductor Laser Diode (LD), or the like to irradiate a wavelength conversion member including phosphors to generate desired light, has been known.

In such a wavelength conversion member, phosphors have conventionally capsulated by resin. However, it is also proposed to fill gaps among the phosphors with zinc oxides (ZnO) (for example, International Publications Nos. 2013/172025 and 2013/175773).

SUMMARY OF THE INVENTION

For the wavelength conversion member as described above, improvements on light-extraction efficiency and endurance have been required.

An object of the present disclosure is to provide a wavelength conversion member and the like with improved light-extraction efficiency and higher endurance.

SUMMARY OF THE INVENTION

According to an aspect of the present disclosure, there is provided a wavelength conversion member including: a substrate; a reflective layer above the substrate, the reflective layer reflecting at least part of light incident from above; an amorphous layer above the reflective layer, the amorphous layer transmitting light; a metal oxide layer above the amorphous layer, the metal oxide layer transmitting light; and a phosphor layer on the metal oxide layer, the phosphor layer including a plurality of phosphors, wherein the phosphor layer further includes a metal oxide between the plurality of phosphors, and the metal oxide in the phosphor layer and an metal oxide in the metal oxide layer are same.

According to another aspect of the present disclosure, there is provided a method of manufacturing a wavelength conversion member, the method including: forming a reflective layer above a substrate, the reflective layer reflecting at least part of light incident from above; forming an amorphous layer above the reflective layer, the amorphous layer transmitting light; forming a metal oxide layer above the amorphous layer, the metal oxide layer transmitting light; depositing a plurality of phosphors on the metal oxide layer; and forming a phosphor layer including a metal oxide between the plurality of phosphors by crystal growth of the metal oxide layer, and the metal oxide in the phosphor and a metal oxide in the metal oxide layer are same.

According to the present disclosure, it is possible to provide a wavelength conversion member with improved light-extraction efficiency and higher endurance, and also a light emitting device and a projector each of which includes the wavelength conversion member.

BRIEF DESCRIPTION OF DRAWINGS

These and other objects, advantages and features of the present disclosure will become apparent from the following description thereof taken in conjunction with the accompanying drawings that illustrate specific embodiments of the present disclosure.

DETAILED DESCRIPTION OF THE PREFERRED EMBODIMENTS

Figure 1:
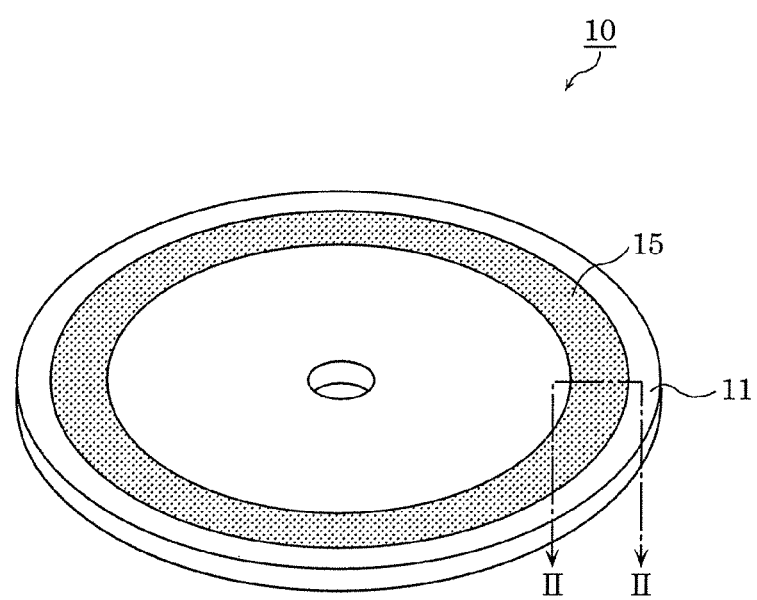
FIG. 1 is an external perspective view of a wavelength conversion member according to Embodiment 1.

Hereinafter, certain exemplary embodiments are described in greater detail with reference to the accompanying Drawings. It should be noted that all the embodiments described below are mere examples of the present disclosure. Numerical values, shapes, substances, structural elements, arrangement positions and connection configuration of the structural elements, and the like described in the following embodiments are mere examples, and are not intended to limit the present disclosure. Therefore, among the constituent elements in the following embodiments, constituent elements that are not described in independent claims that show the most generic concept of the present disclosure are described as elements constituting more desirable configurations.

It should also be noted that these figures in the Drawings are schematic diagrams and are not necessarily exact illustrations. Furthermore, the same reference numerals are assigned to the identical structural elements throughout the figures, so that repeated explanation of the same structural elements is sometimes omitted or simplified.

Embodiment 1

Structure

Figure 2:
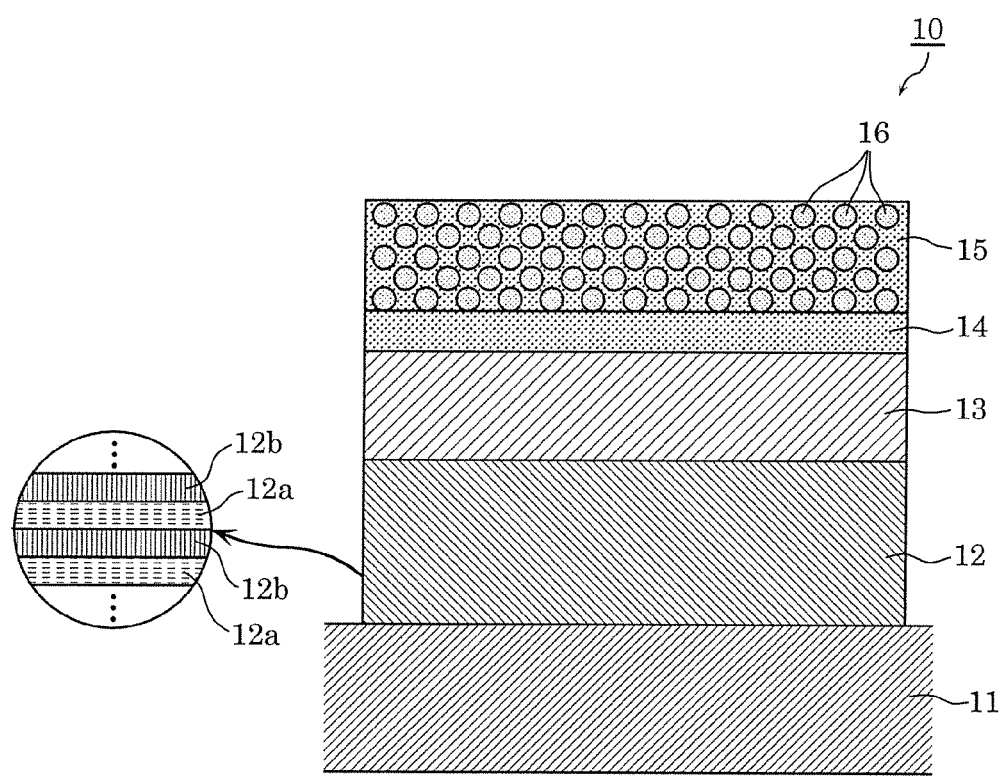
FIG. 2 is a cross-sectional view of the wavelength conversion member (taken along line II-II of FIG. 1) according to Embodiment 1.

First, a structure of a wavelength conversion member according to Embodiment 1 is described with reference to FIGS. 1 and 2. FIG. 1 is an external perspective view of the wavelength conversion member according to Embodiment 1. FIG. 2 is a cross-sectional view of the wavelength conversion member (taken along line II-II of FIG. 1) according to Embodiment 1.

Referring to FIG. 1, wavelength conversion member 10 according to Embodiment 1 is a so-called phosphor wheel provided with phosphor layer 15, and mainly used in projectors.

In more detail, as illustrated in FIGS. 1 and 2, wavelength conversion member 10 includes substrate 11, dichroic mirror layer 12, silicon dioxide ($SiO_2$) layer 13, ZnO layer 14, and phosphor layer 15 including phosphors 16.

Substrate 11 is in the shape of a circular flat plate. Substrate 11 may be or may not be translucent. Examples of substrate 11 are a glass substrate, a quartz substrate, a gallium nitride (GaN) substrate, a sapphire substrate, and a silicon substrate. Substrate 11 may be a film comprising resin, such as a polyethylene naphthalate (PEN) film or a polyethylene terephthalate (PET) film.

Although it is described in Embodiment 1 that substrate 11 is a flat plate in shape, substrate 11 may have a curved surface. If substrate 11 has a curved surface, substrate 11 is desirably a glass substrate that can be easily processed.

Dichroic mirror layer 12 is an example of a reflective layer that is provided above substrate 11 and reflects at least part of light incident from the above. It should be noted that "above" means to the $SiO_2$ layer 13 side of dichroic mirror layer 12.

In more detail, dichroic mirror layer 12 is a multi-layer film (distributed bragg reflective layer) in which low refractive layers 12a each having a low refractive index and high refractive layers 12b each having a high refractive index are alternately stacked More specifically, each of low refractive layers 12a included in dichroic mirror layer 12 may comprise oxide of light element, such as $SiO_2$ or aluminum oxide ($Al_2O_3$). In contrast, each of high refractive layers 12b included in dichroic mirror layer 12 may comprise oxide or oxynitride of rather heavy element, such as titanium oxide ($TiO_2$), $Nb_2O_3$, ZnO, or aluminum oxynitride (AlON).

It is also possible that each of low refractive layers 12a included in dichroic mirror layer 12 comprises a nitride semiconductor including aluminum (Al), such as aluminum nitride (AlN), aluminum gallium nitride (AlGaN) with high Al composition, or aluminum indium nitride (AlInN), and that each of high refractive layers 12b included in dichroic mirror layer 12 comprises a nitride semiconductor including gallium (Ga), such as GaN or AlGaN with low Al composition.

According to Embodiment 1, dichroic mirror layer 12 reflects light in a visible light range. However, it is also possible that dichroic mirror layer 12 reflects only light in a specific wavelength range, and transmits light in the other wavelength range except the specific wavelength range.

$SiO_2$ layer 13 is an amorphous $SiO_2$ layer provided above dichroic mirror layer 12. In other words, $SiO_2$ layer 13 is an example of an amorphous layer transmitting light. $SiO_2$ layer 13 is a characteristic structural element in wavelength conversion member 10. $SiO_2$ layer 13 advantageously influences crystal growth of ZnO layer 14 above $SiO_2$ layer 13 in forming of phosphor layer 15.

ZnO layer 14 is an example of a metal oxide layer that is provided above $SiO_2$ layer 13 and transmits light. More specifically, ZnO layer 14 is a layer comprising ZnO that is c-axis orientated. For example, ZnO layer 14 may comprise ZnO that has been grown with random in-plane crystal orientation.

It should be noted that ZnO layer 14 may comprise single crystal ZnO grown with uniform in-plane crystal orientation. Since single crystal has less grain boundary, single crystal is preferable for reduction of light scattering.

Phosphor layer 15 is a ZnO layer which is provided on ZnO layer 14 and includes a plurality of phosphors 16 (phosphor particles). In other words, phosphor layer 15 includes the same metal oxides as the metal oxides of ZnO layer 14 to fill gaps among the plurality of phosphors 16 with the metal oxides. Phosphor layer 15 is formed by depositing phosphors on ZnO layer 14 and growing crystals of ZnO layer 14.

In Embodiment 1, phosphors 16 are yttrium-aluminum-garnet (YAG) yellow phosphors. However, phosphors 16 are not limited to the example and may be red phosphors or green phosphors. It is also possible that phosphor layer 15 includes various kinds of phosphors 16 having different center wavelengths of emission spectrum. It is further possible that phosphor layer 15 is partitioned to a plurality of regions in a plan view and includes different kinds of phosphors 16 in the respective regions.

When wavelength conversion member 10 as described above receives blue light on phosphor layer 15, phosphors 16 are excited to emit yellow light. Here, a part of the blue light and a part of the yellow light are reflected on dichroic mirror layer 12. As a result, the reflected blue light and the reflected yellow light are mixed together to be white light which wavelength conversion member 10 eventually emits.

[Method of Manufacturing Wavelength Conversion Member]

Next, the method of manufacturing wavelength conversion member 10 is described. FIGS. 3A to 3G are cross-sectional views for explaining the method of manufacturing wavelength conversion member 10. FIG. 4 is a flowchart of the method of manufacturing wavelength conversion member 10.

In wavelength conversion member 10 according to Embodiment 1, crystal growth of ZnO layer 14 fills gaps among phosphors 16 with ZnO to form phosphor layer 15.

Figure 3A:
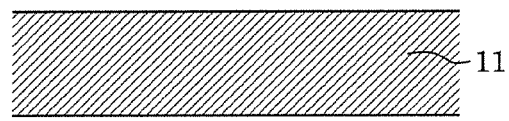
FIG. 3A is the first cross-sectional view for explaining a method of manufacturing the wavelength conversion member according to Embodiment 1.
Figure 3B:
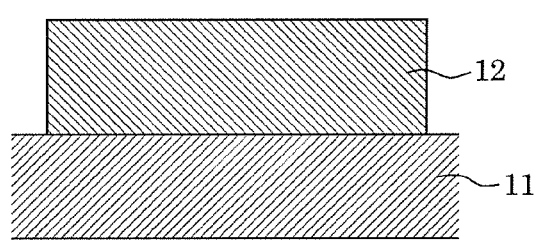
FIG. 3B is the second cross-sectional view for explaining the method of manufacturing the wavelength conversion member according to Embodiment 1.
Figure 4:
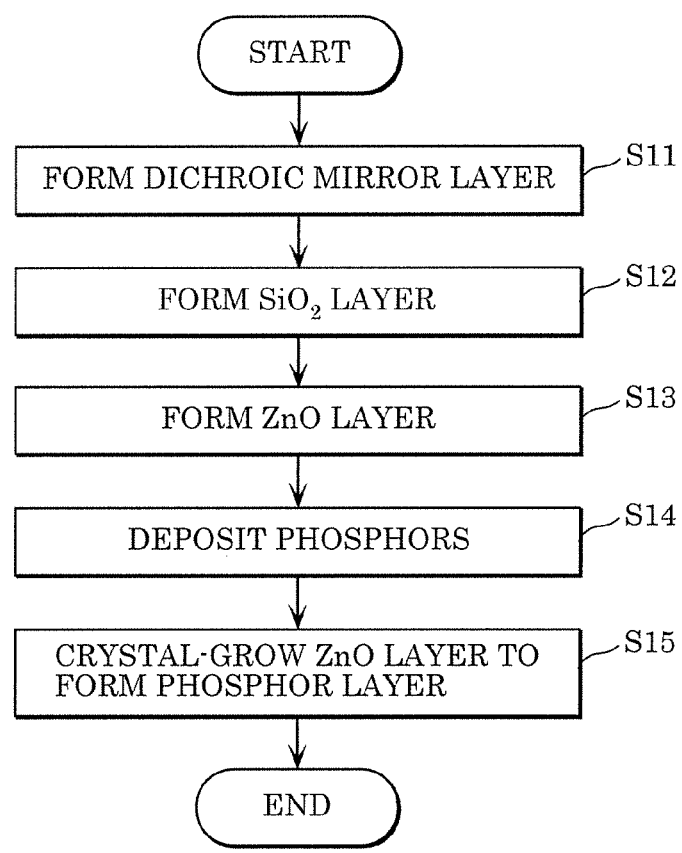
FIG. 4 is a flowchart of the method of manufacturing the wavelength conversion member according to Embodiment 1.

Referring first to FIGS. 3A and 3B, dichroic mirror layer 12 is formed above substrate 11 (S11).

If each of low refractive layers 12a and high refractive layers 12b included in dichroic mirror layer 12 comprises oxide or oxynitride, each of the layers is formed by film formation, such as electron beam evaporation, resistance-heated evaporation, reactive plasma deposition, or sputtering.

If low refractive layers 12a and high refractive layers 12b included in dichroic mirror layer 12 comprises a nitride semiconductor, each of the layers is formed by film formation, such as metal-organic vapor phase epitaxy or molecular beam epitaxy.

Figure 3C:
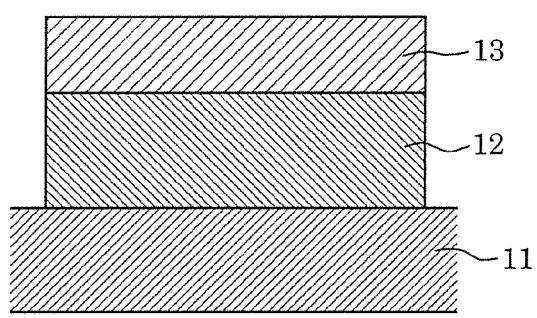
FIG. 3C is the third cross-sectional view for explaining the method of manufacturing the wavelength conversion member according to Embodiment 1.

Referring next to FIG. 3C, $SiO_2$ layer 13 is formed above dichroic mirror layer 12 (S12). The formation of $SiO_2$ layer 13 uses film formation, such as electron beam evaporation, resistance-heated evaporation, reactive plasma deposition, sputtering, metal-organic vapor phase epitaxy, molecular beam epitaxy, or pulsed laser deposition.

Figure 3D:
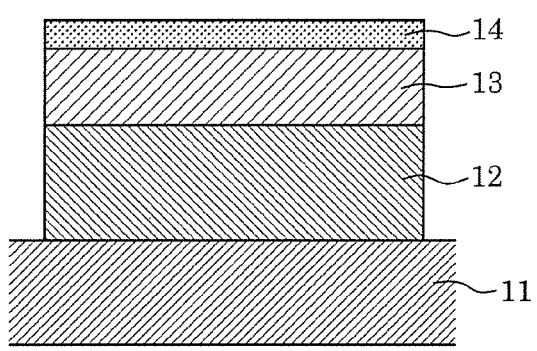
FIG. 3D is the fourth cross-sectional view for explaining the method of manufacturing the wavelength conversion member according to Embodiment 1.

Referring next to FIG. 3D, ZnO layer 14 is formed above $SiO_2$ layer 13 (S12). The formation of ZnO layer 14 uses film formation, such as electron beam evaporation, resistance-heated evaporation, reactive plasma deposition, sputtering, metal-organic vapor phase epitaxy, molecular beam epitaxy, or pulsed laser deposition.

Here, a solution growth method using a solution containing zinc (Zn) ions is used to grow ZnO crystals. In the solution growth method, chemical bath deposition performed at atmospheric pressure, hydrothermal synthesis performed at atmospheric pressure or higher, electrochemical deposition with voltage or current supply, or the like is used. Since ZnO is likely to be grown with c-axis orientation, it is possible to easily form c-axis oriented ZnO layer 14 by controlling film-forming conditions, such as a temperature and a film-forming speed.

It should be noted that, in order to form ZnO layer 14 with low electrical resistance, a dopant of Ga, Al, indium (In), boron (B), or the like may be added to ZnO layer 14.

Figure 3E:
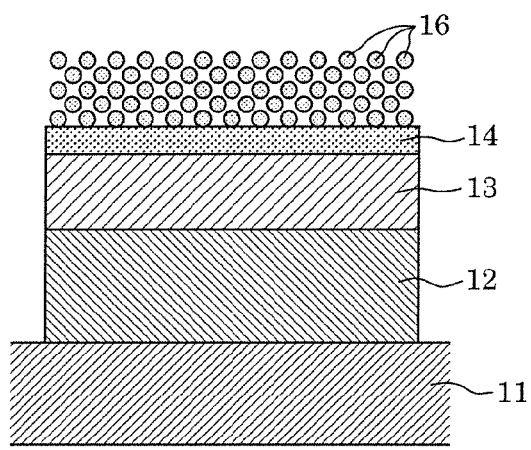
FIG. 3E is the fifth cross-sectional view for explaining the method of manufacturing the wavelength conversion member according to Embodiment 1.

Referring next to FIG. 3E, phosphors 16 are deposited on ZnO layer 14 (S14). An example of the method for depositing phosphors 16 is a technique of depositing (integrating) phosphors 16 onto ZnO layer 14 by electrophoresis using a phosphor-dispersed solution in which phosphors 16 are dispersed. It is also possible to cause phosphors 16 to settle out on ZnO layer 14 to deposit phosphor 16. It is further possible to apply the phosphor-dispersed solution onto ZnO layer 14 and dry the solution.

In either case, phosphors 16 in phosphor layer 15 are aggregated to each other to form a structure, which is different from the conventional techniques of forming a fluorescent layer in which phosphors are dispersed in a resin matrix. As a result, since it is not necessary to control dispersion of phosphors 16 in the matrix, merely controlling an amount of phosphors 16 makes phosphor layer 15 stable to provide necessary fluorescence.

Figure 3F:
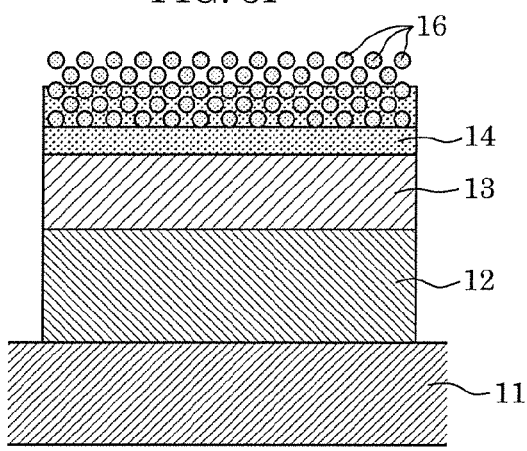
FIG. 3F is the sixth cross-sectional view for explaining the method of manufacturing the wavelength conversion member according to Embodiment 1.
Figure 3G:
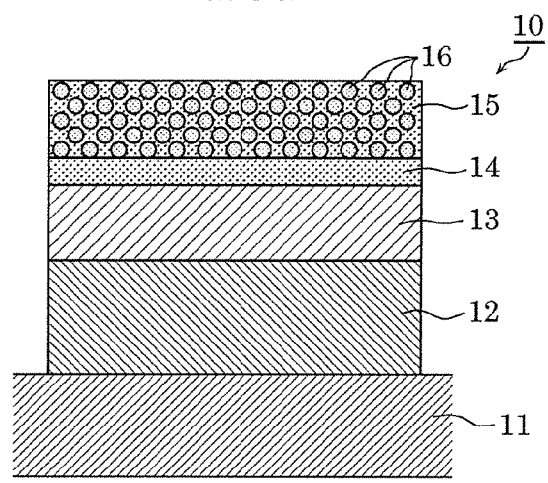
FIG. 3G is the seventh cross-sectional view for explaining the method of manufacturing the wavelength conversion member according to Embodiment 1.

Referring to FIGS. 3F and 3G, ZnO layer 14 is crystal-grown to form phosphor layer 15 (S15). More specifically, ZnO crystals are grown from ZnO layer 14 by a solution growth method using a solution containing Zn ions, so that gaps among phosphors 16 are filled with the ZnO.

In the solution growth method, chemical bath deposition performed at atmospheric pressure, hydrothermal synthesis performed at atmospheric pressure or higher, electrochemical deposition, or the like is used.

The solution used in the crystal growth is, for example, a zinc nitrate solution containing hexamethylenetetramine $((CH_2)_6N_4)$. A zinc nitrate solution has pH ranging from 5 to 7, inclusive, for example. ZnO has such characteristics of being capable of growing in a near-neutral solution, which other oxides do not have.

The ZnO growth in a near-neutral solution results in a low risk that chemical etching causes non-light-emitting recoupling on the surfaces of phosphors 16, which is different from glass filling that requires an alkaline reaction liquid. Therefore, the ZnO filling can more suppress the decrease of quantum efficiency inside phosphors 16 in comparison to glass filling.

FIG. 3F is a view illustrating a state in the process of growing ZnO crystals from ZnO layer 14 of FIG. 3E. By using a solution growth method capable of growing crystals in a near equilibrium state with ZnO layer 14 as a core of the crystal growth (in other words, as seed crystals), ZnO crystals are sequentially grown from ZnO layer 14 located under phosphors 16 upwards. As a result, the ZnO formed by the crystal growth keeps the crystal state of ZnO layer 14 serving as an underlayer.

Therefore, phosphor layer 15 has the same fine ZnO crystals as those in ZnO layer 14. After the ZnO formed by the crystal growth grows to fill gaps among phosphors 16, the ZnO then grow in a lateral direction to cover an upper region of phosphors 16. It should be noted that phosphor layer 15 may be added with dopant, such as magnesium (Mg).

In the solution growth method, a raw substance solution is dilute and has a low viscosity, so that the solution can easily reach the gaps among phosphors 16. Furthermore, Zn ions serving as substance causing the ZnO crystal growth are small enough to be easily diffused and reach the inside of phosphor layer 15 from the raw solution outside phosphor layer 15, even if part of the Zn ions are consumed in the ZnO crystal growth. This can prevent void inside phosphor layer 15 which is caused by raw substance shortage.

[Effects and Others]

In wavelength conversion member 10, ZnO layer 14 is provided above $SiO_2$ layer 13. In wavelength conversion member 10, in comparison to the case without provision of $SiO_2$ layer 13, crystal growth of ZnO layer 14 is further facilitated to increase crystalline of ZnO in phosphor layer 15, and gaps among phosphors 16 is thereby filled with ZnO (sealing phosphors 16) more closely. If gaps among phosphors 16 are formed in phosphor layer 15, there is a case where the gaps increase light scattering and reduce thermal conductivity, for example, to eventually decrease light-extraction efficiency. In order to address this, wavelength conversion member 10 is provided with $SiO_2$ layer 13 to suppress the occurrence of gaps among phosphors 16 in phosphor layer 15 and thereby increase light-extraction efficiency.

Furthermore, $SiO_2$ layer 13 is located between phosphor layer 15 and dichroic mirror layer 12. Here, $SiO_2$ layer 13 serves also as a barrier layer for reducing influence, on dichroic mirror layer 12, of heat caused in phosphor layer 15 when blue light is incident on wavelength conversion member 10 (hereinafter, expressed also as "when wavelength conversion member 10 is being used" or "in use of wavelength conversion member 10"). As a result, it is possible to suppress deterioration of dichroic mirror layer 12 caused by the heat and thereby increase endurance (reliability).

It should be noted that if $SiO_2$ layer 13 is too thin, there is a case where effects of increasing crystalline of ZnO in phosphor layer 15 are not sufficiently produced. In order to address this, a thickness of $SiO_2$ layer 13 is, for example, desirably greater than or equal to a thickness of low refractive layer 12a included in dichroic mirror layer 12.

Moreover, if $SiO_2$ layer 13 is too thin, there is a further risk that deterioration of thermal conductive properties of $SiO_2$ layer 13 increases a temperature of phosphor layer 15 in use of wavelength conversion member 10, thereby decreasing light emission efficiency of phosphors 16. In such a case, the thickness of $SiO_2$ layer 13 may have an upper limit. In practice, the thickness of $SiO_2$ layer 13 is expected to range approximately from 500 nm to 200 nm, inclusive.

Embodiment 2

Although dichroic mirror layer 12 is used as a reflective layer in Embodiment 1, it is also possible to use a metal reflective layer as a reflective layer. In Embodiment 2, description is given for wavelength conversion member 10a provided with an example of such a metal reflective layer, In this example, the metal reflective layer includes an Al reflective layer. It should be noted that in Embodiment 2, differences from Embodiment 1 are mainly described and the same explanation as given in Embodiment 1 is not repeated.

[Structure]

Figure 5:
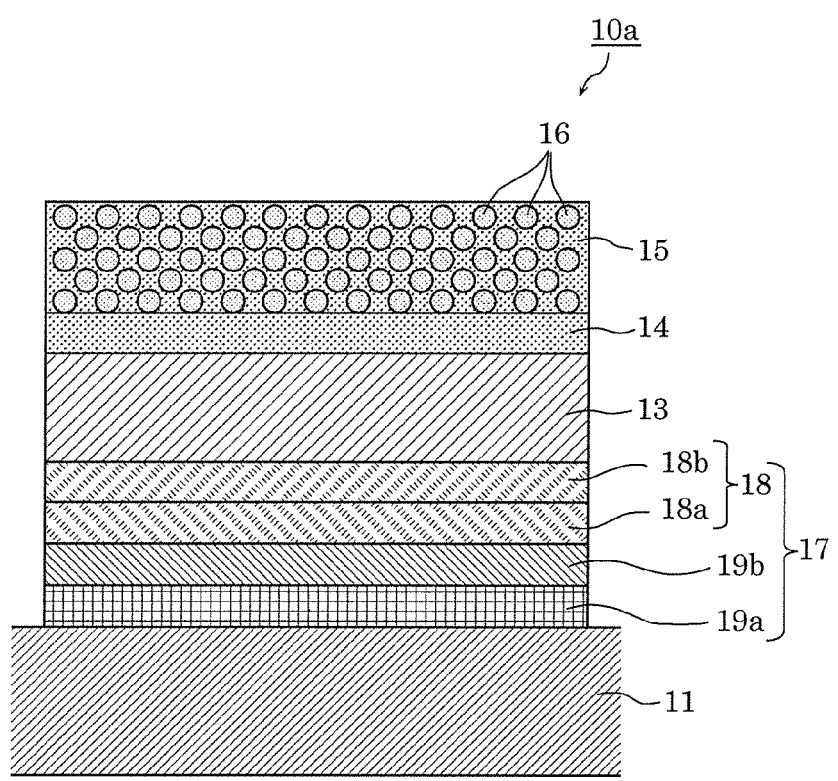
FIG. 5 is a cross-sectional view of a wavelength conversion member according to Embodiment 2.

First, a structure of a wavelength conversion member according to Embodiment 2 is described with reference to FIG. 5. FIG. 5 is a cross-sectional view of the wavelength conversion member according to Embodiment 2.

Referring to FIG. 5, wavelength conversion member 10a includes substrate 11, metal reflective layer 17, $SiO_2$ layer 13, ZnO layer 14, and phosphor layer 15 including phosphors 16.

Metal reflective layer 17 includes reflection enhancing layer 18 and Al reflective layer 19b. Reflection enhancing layer 18 is located in an upper part of metal reflective layer 17, and includes low refractive layer 18a having a low refractive index and high refractive layer 18b having a high refractive index. Metal reflective layer 17 also includes niobium (Nb) adhesion layer 19a.

Nb adhesion layer 19a is provided to increase adhesion properties of Al reflective layer 19b to substrate 11. Nb adhesion layer 19a is formed above substrate 11.

Al reflective layer 19b is a reflective layer comprising Al. Al reflective layer 19b is provided above Nb adhesion layer 19a.

Reflection enhancing layer 18 is provided to reduce a loss caused by light scattering at an interface between Al reflective layer 19b and $SiO_2$ layer 13, and formed above Al reflective layer 19b. Reflection enhancing layer 18 includes low refractive layer 18a and high refractive layer 18b.

More specifically, low refractive layer 18a comprises oxide of light element, such as $SiO_2$ or $Al_2O_3$. In contrast, high refractive layer 18b comprises oxide or oxynitride of rather heavy element, such as $TiO_2$, $Nb_2O_3$, ZnO, or AlON.

It should be noted that Nb adhesion layer 19a and reflection enhancing layer 18 are not necessarily provided.

[Effects and Others]

Also in wavelength conversion member 10a, ZnO layer 14 is provided above $SiO_2$ layer 13. Wavelength conversion member 10a is therefore capable of facilitating crystal growth of ZnO layer 14 to increase crystalline of ZnO in phosphor layer 15, thereby filling gaps among phosphors 16 with ZnO (sealing phosphors 16) more closely. In other words, wavelength conversion member 10a is capable of suppressing the occurrence of the gaps among phosphors 16 in phosphor layer 15 and thereby increasing light-extraction efficiency.

Furthermore, $SiO_2$ layer 13 is located between phosphor layer 15 and Al reflective layer 19b. Here, $SiO_2$ layer 13 serves also as a barrier layer for reducing influence, on Al reflective layer 19b, of heat caused in phosphor layer 15 in use of wavelength conversion member 10a. As a result, it is possible to suppress deterioration of Al reflective layer 19b caused by the heat and thereby increase endurance (reliability).

It is considered that $SiO_2$ layer 13 produces further effects of suppressing deterioration (reflectivity decrease caused by oxidation) by blocking not only heat but also oxygen not to enter Al reflective layer 19b.

If $SiO_2$ layer 13 is too thin, there is a case where the effects of suppressing oxidation of Al reflective layer 19b are not sufficiently produced. In order to address this, the thickness of $SiO_2$ layer 13 is, for example, desirably greater than or equal to a thickness of low refractive layer 18a included in metal reflective layer 17.

Embodiment 3

[Structure]

Figure 6:
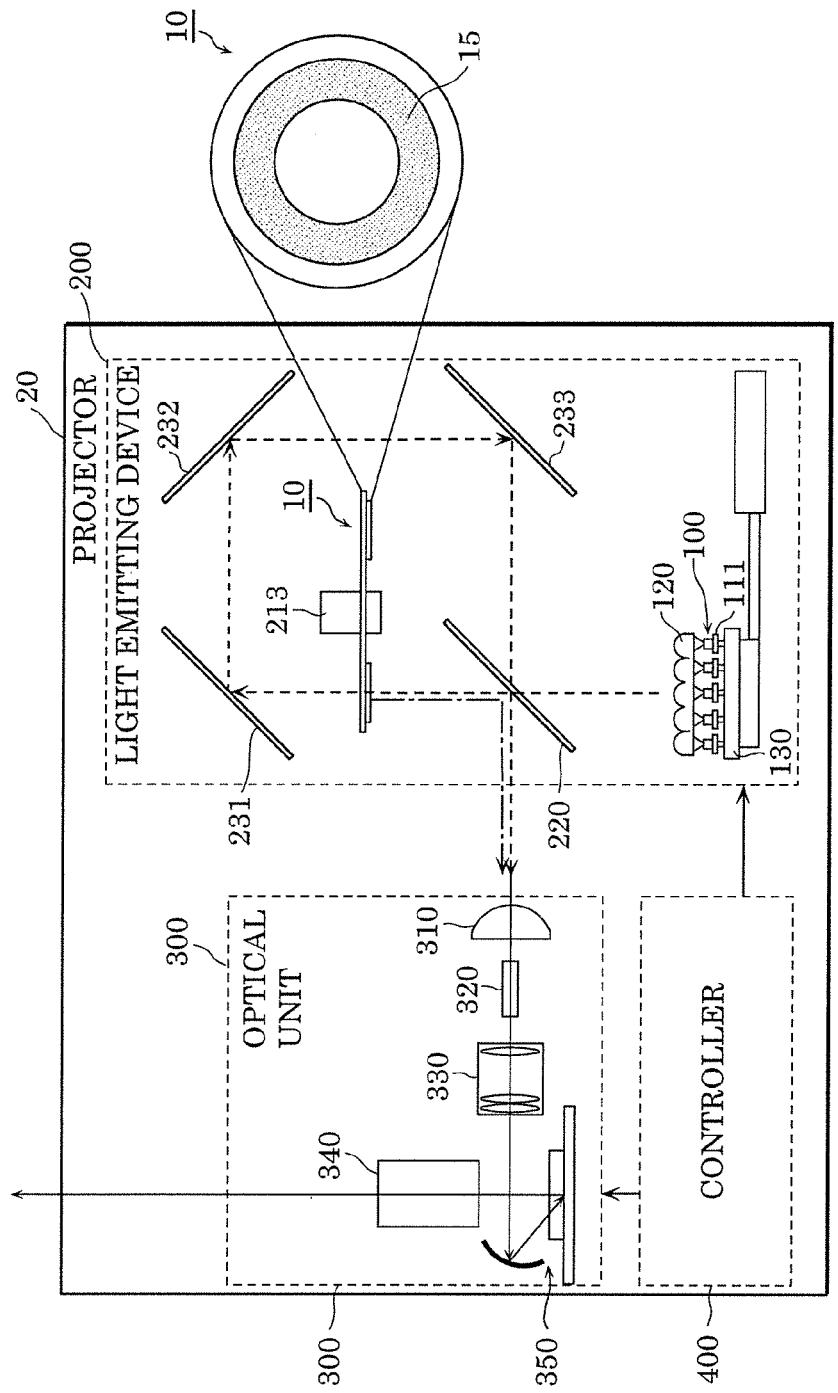
FIG. 6 is a diagram illustrating a structure of a projector according to Embodiment 3.

The present disclosure may be implemented to a projector including the wavelength conversion member according to any one of the above-described embodiments. The following describes a projector according to Embodiment 3 with reference to FIG. 6. FIG. 6 is a diagram illustrating a structure of the projector according to Embodiment 3.

It is assumed in Embodiment 3 that dichroic mirror layer 12 in wavelength conversion member 10 has properties of reflecting yellow light emitted by phosphors 16 and transmitting blue light, and that substrate 11 is a translucent substrate comprising sapphire or the like.

Referring to FIG. 6, projector 20 includes light emitting device 200, optical unit 300, and controller 400.

Light emitting device 200 is a device serving as a light source of projector 20. light emitting device 200 includes wavelength conversion member 10 and irradiation unit 100. Light emitting device 200 further includes dichroic mirror 220 and reflective mirrors 231, 232, and 233.

Wavelength conversion member 10 is attached to motor 213 to be rotated. Motor 213 is driven according to drive control signal provided from controller 400.

Irradiation unit 100 emits light for exciting phosphors 16 towards wavelength conversion member 10 from phosphor layer 15 side. More specifically, irradiation unit 100 includes a plurality of semiconductor light emitting elements 111 (excitation light sources), collimating lens 120 for collimating the light emitted from semiconductor light emitting elements 111, and heat sink 130.

Semiconductor light emitting elements 111 are, for example, semiconductor lasers or light emitting diodes (LEDs), and are driven by driving current to emit light having a predetermined color (wavelength). In Embodiment 3, semiconductor lasers emitting blue light having a wavelength ranging from 360 nm to 480 nm, inclusive, are used as semiconductor light emitting elements 111. Controller 400 controls light emission of semiconductor light emitting elements 111. Although a plurality of semiconductor light emitting elements 111 are provided in this example, it is also possible to provide single semiconductor light emitting element 111.

Dichroic mirror 220 has properties of transmitting blue light (excitation light) provided from irradiation unit 100, and reflecting light having a longer wavelength than a wavelength of this blue light. In other words, dichroic mirror 220 reflects yellow light provided from wavelength conversion member 10.

Optical unit 300 includes condenser lens 310, rod integrator 320, lens group 330, projection lens 340, and display element 350.

Condenser lens 310 collects light provided from light emitting device 200 onto an incident end face of rod integrator 320.

Rod integrator 320 receives the light collected by condenser lens 310 on the incident end face, and causes luminance distribution of the received light to be homogeneous, and outputs the resulting light. Rod integrator 320 is, for example, a square pillar in shape. The light incident on rod integrator 320 repeats total reflection in the medium of the square pillar to have homogeneous luminance distribution, and is then outputted.

Lens group 330 causes the light provided from rod integrator 320, to be incident on display element 350. Lens group 330 is a lens unit including a plurality of lenses. For example, lens group 330 includes a condenser lens, a relay lens, and the like.

Projection lens 340 is a lens that projects light provided from display element 350 to the outside of projector 20. Projection lens 340 is a projection lens group (projection unit) including one or more lenses. For example, projection lens 340 includes a biconvex lens, a diaphragm, a planoconcave lens, and the like.

Display element 350 controls the light provided from lens group 330 to be outputted as image. More specifically, display element 350 is a digital mirror device (DMD) serving as an image device.

Controller 400 controls light emitting device 200 (irradiation unit 100 and motor 213) and display element 350. In practice, controller 400 is implemented to a microcomputer, a processor, a dedicated circuit, or the like.

[Operations]

Next, operations performed by projector 20 is described.

Blue light emitted from irradiation unit 100 passes through dichroic mirror 220 to be incident on wavelength conversion member 10. Here, the previously-described characteristics of dichroic mirror layer 12 causes wavelength conversion member 10 to transmit blue light and reflect yellow light on wavelength conversion member 10. More specifically, wavelength conversion member 10 emits yellow light towards dichroic mirror 220, and blue light towards reflective mirror 231. Here, wavelength conversion member 10 is rotated by motor 213.

The yellow light reflected on wavelength conversion member 10 is then reflected on dichroic mirror 220 to be guided to optical unit 300. On the other hand, the blue light passing through wavelength conversion member 10 is sequentially reflected on reflective mirror 231, reflective mirror 232, and reflective mirror 233, and then passes through dichroic mirror 220 to be guided to optical unit 300. In other words, optical unit 300 receives white light that is mixture of the blue light and the yellow light.

The white light provided to optical unit 300 is guided to display element 350 via condenser lens 310, rod integrator 320, and lens group 330, and then formed in display element 350 to be image (projection light) based on projection signal provided from controller 400 and is outputted from display element 350. In this case, the image is monochrome.

Then, the image outputted from display element 350 is projected from projection lens 340 onto an object, such as a screen.

Figure 7:
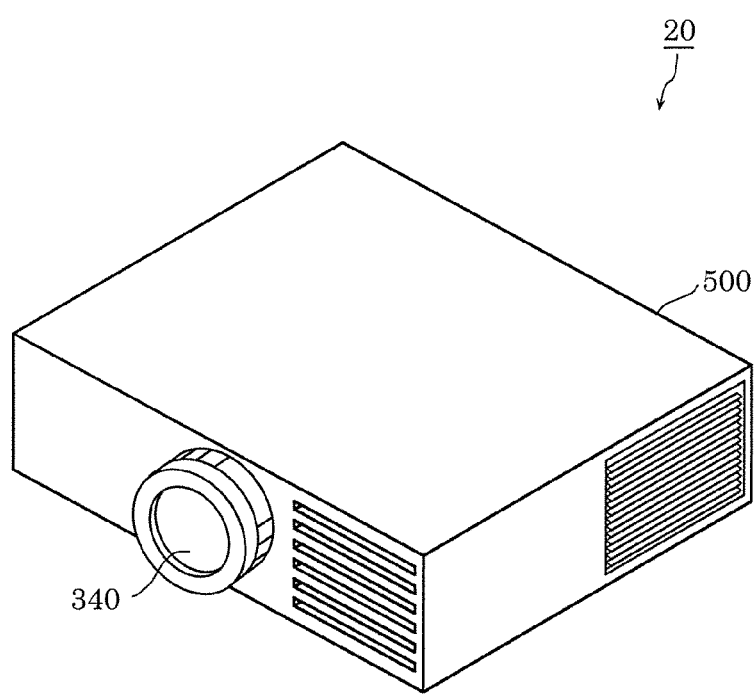
FIG. 7 is an external perspective view of the projector according to Embodiment 3.

In projector 20, as illustrated in FIG. 7, light emitting device 200, optical unit 300, and controller 400 are accommodated in housing 500. FIG. 7 is an external perspective view of projector 20.

[Conclusion]

As described above, the present disclosure is implemented to projector 20 including wavelength conversion member 10. In other words, wavelength conversion member 10 makes projector 20 have improved light-extraction efficiency and higher endurance.

It should be noted that projector 20 is an example, and the wavelength conversion member according to the present disclosure exemplified as wavelength conversion member 10 and wavelength conversion member 10a is usable in projectors having various existing optical systems.

Furthermore, the present disclosure may be implemented to a light emitting device (for example, light emitting device 200) included in projectors.

Variations

Although Embodiments 1 to 3 have been described above, the present disclosure is not limited to these embodiments.

Although $SiO_2$ layer 13 (amorphous layer comprising $SiO_2$) is used as an amorphous layer in the above embodiments, the amorphous layer may be other amorphous layers, such as an amorphous layer comprising $TiO_2$.

Although ZnO layer 14 is used as a metal oxide layer in the above-described embodiments, the metal oxide layer may be other layers comprising other metal oxides.

Although the wavelength conversion member used in a projector has been described in the above embodiments, the use of the wavelength conversion member is not specifically limited. The wavelength conversion member according to the present disclosure may be adapted to other uses, such as illumination or display.

The multi-layer structure illustrated in the cross-sectional views according to the above-described embodiments is a mere example. The present disclosure is not limited to this multi-layer structure. In other words, other multi-layer structures capable of performing the characteristic functions of the present disclosure in the same manner as the previously-described multi-layer structure are also included in the present disclosure. For example, it is possible to provide another layer between the layers in the previously-described multi-layer structure as long as the same functions as those of the multi-layer structure can be performed.

It should also be noted that the substance of each of the layers in the multi-layer structure is described as an example of main substance. Each of the layers may include other substance as long as the same functions as those of the multi-layer structure can be performed.

Embodiment 4

Subsequently, a light emitting device according to Embodiment 4 is described.

Conventionally, a light emitting device including phosphors that are excited by laser is known (for example, Japanese unexamined patent application publications Nos.

2012-54272 and 2013-12358). A phosphor emits light (fluorescence) when laser light is incident on the phosphor and electrons in the phosphor are thereby excited to fall back to their ground state. By guiding the fluorescence emitted from the phosphors to a desired direction, this fluorescence can be used for illumination apparatuses and the like.

For example, Japanese unexamined patent application publication No. 2012-54272 discloses an illumination apparatus that extracts fluorescence, which is emitted from phosphors when laser light is incident directly on the phosphors, through a translucent window provided above the phosphors. Japanese unexamined patent application publication No. 2013-12358 discloses a laser light source device including a reflective mirror that guides fluorescence emitted from phosphors towards a predetermined direction.

However, the above-described conventional light emitting devices have a difficulty of increasing heat dissipating properties, while a high reflectivity is maintained.

It is therefore an object of the following embodiments to provide a device capable of increasing heat dissipating properties while a high reflectivity is maintained.

In order to address the above object, according to an aspect of the present disclosure, there is provided a light emitting device including: a ceramic phosphor that is excited by laser; and a reflective layer with a light reflectivity, the reflective layer being in contact with a surface of the ceramic phosphor which is different from a surface on which the laser is incident.

According to the aspect of the present disclosure, it is possible to increase heat dissipating properties, while a high reflectivity is maintained.

[Light Emitting Device]

Figure 8:
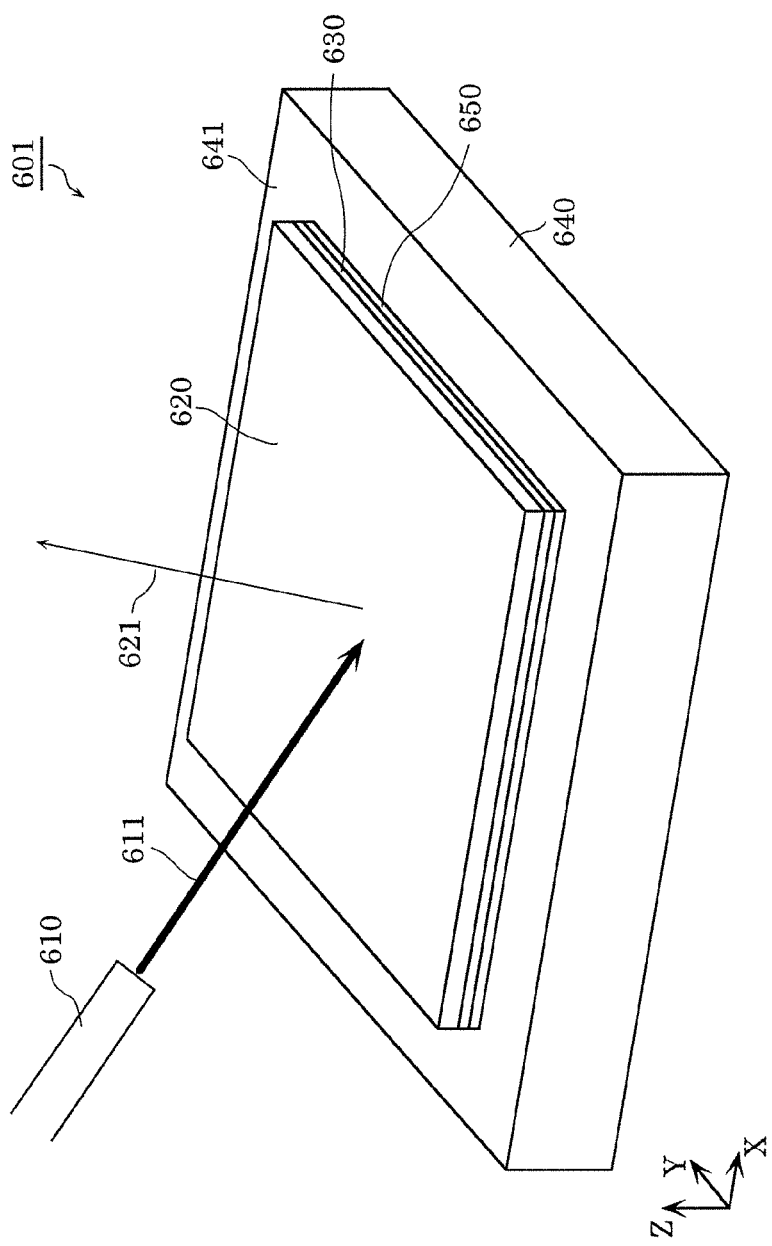
FIG. 8 is a schematic perspective view of a light emitting device according to Embodiment 4.
Figure 9:
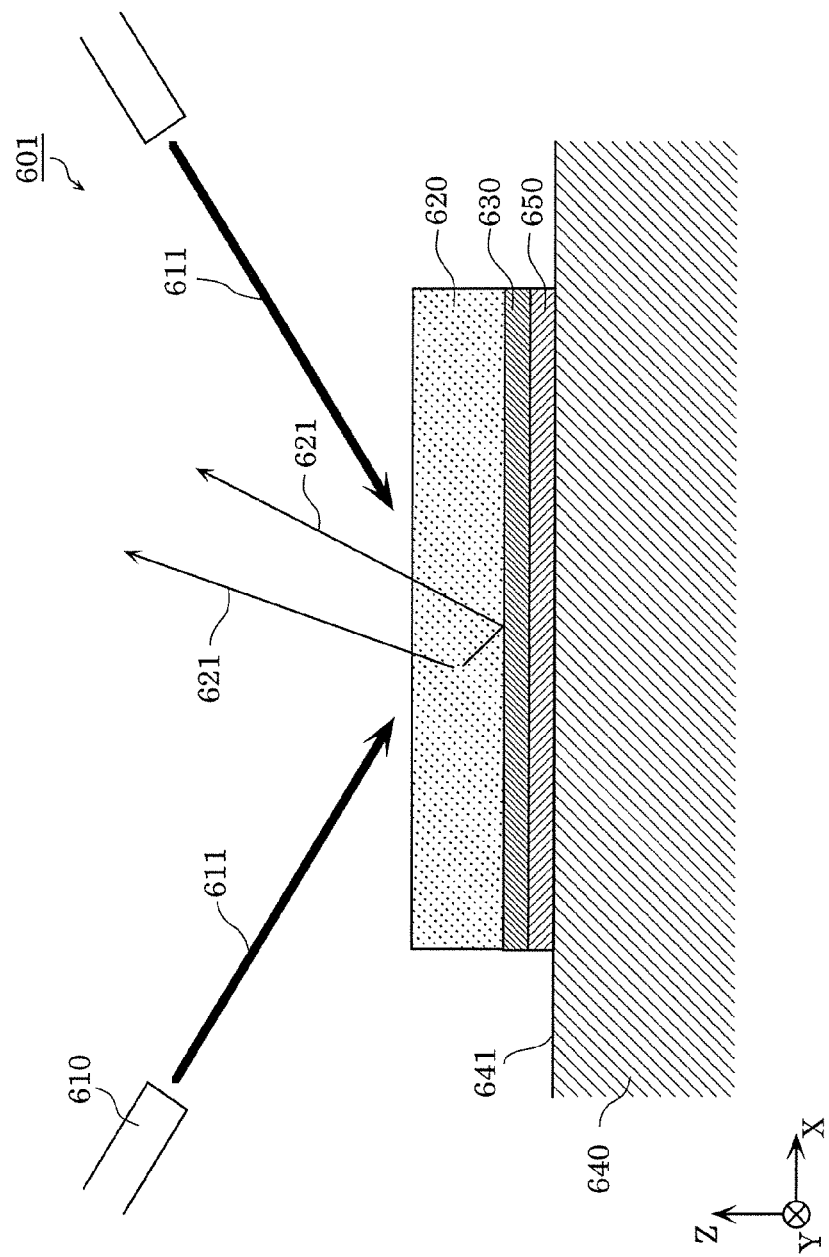
FIG. 9 is a cross-sectional view of the light emitting device according to Embodiment 4.

First, a light emitting device according to Embodiment 4 is described with reference to FIGS. 8 and 9. FIG. 8 is a schematic perspective view of light emitting device 601 according to the present embodiment. FIG. 9 is a cross-sectional view of light emitting device 601 according to the present embodiment.

Referring to FIGS. 8 and 9, light emitting device 601 includes laser light source 610, ceramic phosphor 620, reflective layer 630, heat sink 640, and adhesion layer 650.

When laser light source 610 emits laser light 611 to ceramic phosphor 620, ceramic phosphor 620 emits light 621. Ceramic phosphor 620 is fixed to placement surface 641 of heat sink 640 to sandwich reflective layer 630 and adhesion layer 650.

In each of FIGS. 8 and 9, a normal direction of placement surface 641 of heat sink 640 is expressed as a Z-axis direction, and two directions parallel to the normal direction and perpendicular to each other are expressed as an X-axis direction and a Y-axis direction. Therefore, placement surface 641 is in parallel to an XY plane.

The following describes each of structural elements in light emitting device 601 according to the present embodiment in more detail.

[Laser Light Source]

Laser light source 610 is, for example, a semiconductor laser or an LED. Laser light source 610 is driven by driving current to emit laser light having a predetermined color (wavelength) towards ceramic phosphor 620. More specifically, laser light source 610 emits ultraviolet light or violet or blue visible light as laser light 611. Laser light 611 is excitation light for exciting phosphors included in ceramic phosphor 620. An irradiation intensity and a wavelength of laser light 611 are not limited as long as laser light 611 can excite electrons of the phosphors.

Although FIG. 8 illustrates single laser light source 610, it is also possible that light emitting device 601 includes a plurality of laser light sources 610 as illustrated in FIG. 9. The plurality of laser light sources 610 are arranged so as to emit laser light 611 from respective different directions to ceramic phosphor 620. For example, laser light sources 610 may be arranged in a circular pattern, surrounding ceramic phosphor 620.

[Ceramic Phosphor]

Ceramic phosphor 620 is a ceramic phosphor that is excited by laser, and has a plate-shaped ceramic structure including phosphors. More specifically, as illustrated in FIGS. 8 and 9, ceramic phosphor 620 comprises ceramic in the shape of a single flat plate having two principal surfaces facing each other. The phosphors are dispersed in entire ceramic phosphor 620. One of the two principal surfaces (upper surface) is a surface on which laser light 611 is incident (hereinafter, referred to also as a "laser incident surface"). The other principal surface (lower surface) is provided with reflective layer 630.

Referring to FIG. 8, the shape of ceramic phosphor 620 in the plan view is, for example, a rectangle. Here, in the present embodiment, "plan view" means a view from a side irradiated by laser light 611 (in other words, a view from a Z-axis positive direction). However, the shape of ceramic phosphor 620 in the plan view is not limited to a rectangle, but may be other shapes, such as a square, a circle, and an ellipse.

In the present embodiment, ceramic phosphor 620 is a flat plate in shape, comprising ceramic such as alumina (aluminum oxide ($Al_2O_3$)). However, the ceramic is not limited to alumina, but may be zirconia (zirconium oxide ($ZrO_2$)), zinc oxide (ZnO), or the like.

Ceramic phosphor 620 is formed by sintering ceramic particles. More specifically, a ceramic substance such as alumina particles, scattering substance or sintering agent (additive agent), and phosphors are mixed together, and then the resulting mixture is added with binder and hot-formed and then burned to form ceramic phosphor 620.

The phosphors are not limited and may be any phosphors, such as yellow phosphors, red phosphors, or green phosphors, or a combination of these color phosphors. For example, YAG phosphor particles, CASN ($CaAlSiN_3$) or the like may be used as the phosphors.

When ceramic phosphor 620 is irradiated by laser light 611, electrons of the phosphors are excited. When the excited electrons fall back to their ground state, light (fluorescence) is emitted. The fluorescence is partly emitted directly to the side irradiated by laser light 611 (hereinafter, referred to as "light emitting side"), and partly reflected on reflective layer 630 to be guided to the light emitting side of laser light 611.

Light 621 emitted from ceramic phosphor 620 may include fluorescence emitted by the phosphors and laser light 611 that is excitation light. In other words, light emitting device 601 may emit synthetic light of the fluorescence and laser light 611 to the outside as light 621. For example, when blue light is used as laser light 611, laser light 611 is scattered inside ceramic phosphor 620 so that part of laser light 611 is emitted as blue light without being absorbed and converted in the phosphors. Therefore, ceramic phosphor 620 is capable of emitting white light 621 that is generated from the blue light and the fluorescence (for example, yellow light) emitted from the phosphors.

[Reflective Layer]

Reflective layer 630 has a light reflectivity, and provided in contact with a surface of ceramic phosphor 620 which is different from the laser incident surface (upper surface). More specifically, reflective layer 630 is in contact with the surface (lower surface) opposite the laser incident surface. More specifically, reflective layer 630 is a metal thin film in contact with the entire lower surface of ceramic phosphor 620.

Reflective layer 630 reflects light 621 that is emitted from ceramic phosphor 620. In other words, reflective layer 630 reflects laser light 611 and fluorescence that is emitted by the phosphors included in ceramic phosphor 620. The reflection of the fluorescence on reflective layer 630 increases light-extraction efficiency of light emitting towards the upper surface of ceramic phosphor 620. Furthermore, since reflective layer 630 reflects laser light 611, reflected laser light 611 can further excite the electrons of the phosphors in ceramic phosphor 620. This can increase a light amount of fluorescence, thereby further increasing the light-extraction efficiency.

In the present embodiment, reflective layer 630 is an evaporated metal film. In other words, reflective layer 630 is formed by depositing a metal on the lower surface of ceramic phosphor 620 by vapor deposition. Examples of the vapor deposition are vacuum evaporation, chemical vapor deposition (CVD), ion beam assisted deposition, and the like. However, the forming of reflective layer 630 uses not only vapor deposition, but may also use coating, sputtering, gas cluster ion beam (GCIB), and the like. A thickness of reflective layer 630 is, for example, in a range from 0.1 μm to 1 μm, inclusive.

Reflective layer 630 has a high light reflectivity and a low light absorption. It should be noted that the light reflection on reflective layer 630 is not limited to specular reflection but may also be diffuse reflection. The light reflectivity on reflective layer 630 is, for example, 80% or higher, or preferably 90% or higher. The light absorption in reflective layer 630 is, for example, 20% or lower, or preferably 10% or lower.

In the present embodiment, reflective layer 630 comprises a thermal conductive material (Thermal Interface Material (TIM)). For example, reflective layer 630 comprises a metal, such as aluminum or silver. More specifically, reflective layer 630 can comprise a substance having a thermal conductivity in a range from 50 W/m·K to 400 W/m·K or more than the range. However, reflective layer 630 do not comprise silicon oxide ($SiO_2$) and titanium oxide ($TiO_2$).

[Heat Sink]

Heat sink 640 is an example of a heat dissipater on which ceramic phosphor 620 is placed. Heat sink 640 is a heat dissipating member that dissipates heat generated in phosphors included in ceramic phosphor 620 to the outside (atmosphere). Therefore, heat sink 640 is preferably formed to comprise a material with a high thermal conductivity, such as a metal. Heat sink 640 comprises, for example, aluminum die-casting including aluminum alloy. Furthermore, heat sink 640 may be, for example, provided with a plurality of heat dissipating fins (not illustrated).

Placement surface 641 of heat sink 640 is one of the surfaces of heat sink 640, and is a surface on which ceramic phosphor 620 is placed. Specifically, ceramic phosphor 620 is placed on placement surface 641, sandwiching reflective layer 630 between ceramic phosphor 620 and adhesion layer 650. More specifically, ceramic phosphor 620 having a lower surface provided with reflective layer 630 is placed on placement surface 641 coated with adhesive substance (adhesion layer 650). This structure allows ceramic phosphor 620 to be easily fixed to heat sink 640.

[Adhesion Layer]

Adhesion layer 650 comprises a thermal conductive material and causes reflective layer 630 and heat sink 640 to adhere to each other. For example, adhesion layer 650 is solder, silver paste, or the like. For adhesion layer 650, not only a metal but also a resin, such as grease or SARCON sheet, may be used. For example, for adhesion layer 650, a substance having a thermal conductivity in a range from 1 W/m·K to 100 W/m·K or more than the range can be used.

[Thermal Conductive Properties]

Figure 10:
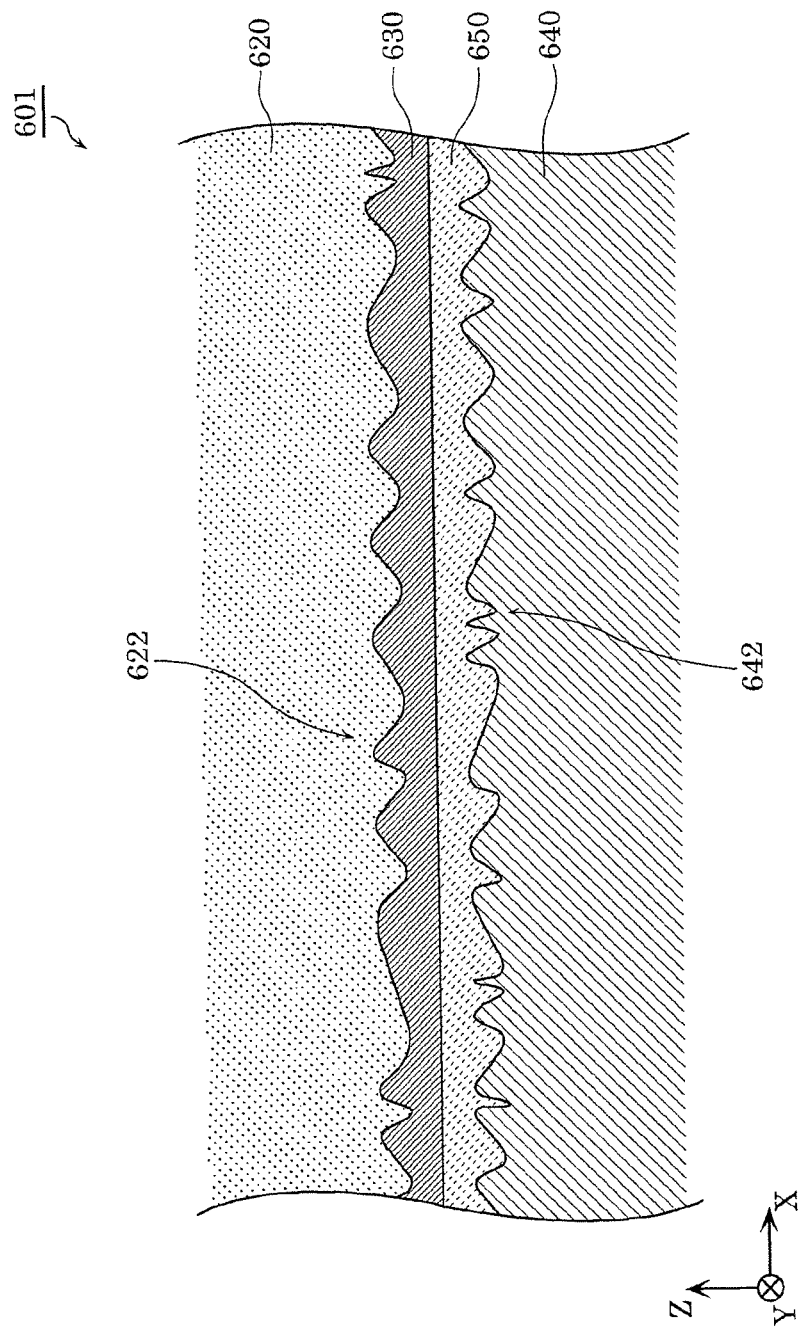
FIG. 10 is a schematic view of a cross-section between a ceramic phosphor and a heat sink in the light emitting device according to Embodiment 4.

The following describes thermal conductive properties of heat generated in ceramic phosphor 620 in light emitting device 601 according to the present embodiment with reference to FIG. 10. FIG. 10 is a schematic view illustrating a cross section between ceramic phosphor 620 and heat sink 640 in light emitting device 601 according to the present embodiment.

Referring to FIG. 10, the lower surface of ceramic phosphor 620 has fine, uneven texture 622. Reflective layer 630 is provided to cover texture 622 to planarize the lower surface of ceramic phosphor 620.

Likewise, placement surface 641 of heat sink 640 also has fine, uneven texture 642. Adhesion layer 650 is provided to cover texture 642 to planarize placement surface 641 of heat sink 640.

For example, if reflective layer 630 and adhesion layer 650 are not provided, texture 622 of ceramic phosphor 620 is in contact with texture 642 of heat sink 640, so that an area in which ceramic phosphor 620 and heat sink 640 are in contact with is small. Furthermore, a part in which texture 622 and texture 642 are not in contact with each other includes air, thereby decreasing a thermal conductivity.

In contrast, in the present embodiment, the flat surface of reflective layer 630 and the flat surface of adhesion layer 650 are in contact with each other. As a result, an area in which reflective layer 630 and adhesion layer 650 are actually in contact with each other is increased. Therefore, heat generated from ceramic phosphor 620 is efficiently conducted through reflective layer 630 and adhesion layer 650 and eventually to heat sink 640.

[Effects Etc.]

Like light emitting device 601 according to the present embodiment, if ceramic phosphor 620 that is excited by laser is used, it is required to efficiently conduct heat generated in ceramic phosphor 620 to heat sink 640. For example, if ceramic phosphor 620 and heat sink 640 are in contact directly with each other, heat generated in ceramic phosphor 620 can be efficiently conducted to heat sink 640.

Here, in order to cause ceramic phosphor 620 and heat sink 640 to be in contact directly with each other, it is necessary to press ceramic phosphor 620 onto heat sink 640. However, ceramic phosphor 620 comprising ceramic is easily damaged by pressing force. For example, if ceramic phosphor 620 is pressed on heat sink 640 by strong force, there is a risk that ceramic phosphor 620 cannot withstand thermal expansion and is broken.

In terms of this point, it is considered that ceramic phosphor 620 is fixed to heat sink 640 by using an adhesive substance having a high thermal conductivity, not by pressing ceramic phosphor 620 onto heat sink 640.

In general, the adhesive substance is grease or SARCON sheet. However, each of grease or SARCON sheet mainly comprises resin, so that there is a risk that irradiation of high-energy laser light 611 causes the grease or SARCON sheet to locally have a temperature exceeding its upper temperature limit. Moreover, grease or SARCON sheet absorbs laser light 611 which passes through the lower surface side of ceramic phosphor 620. Therefore, the number of electrons excited by laser light 611 is decreased, and eventually extracted light 621 (fluorescence) is reduced.

It is therefore impossible to use an adhesive substance comprising resin in order to cause ceramic phosphor 620 and heat sink 640 to adhere directly to each other.

In contrast, light emitting device 601 according to the present embodiment includes: ceramic phosphor 620 that is excited by laser; and reflective layer 630 that has a light reflectivity and is in contact with a surface of ceramic phosphor 620 which is different from the surface on which laser is incident. Furthermore, ceramic phosphor 620 has a plate-shaped ceramic structure having two principal surfaces facing each other, and one of the two principal surfaces is a surface on which laser is incident, and reflective layer 630 is provided to the other one of the two principal surfaces.

With the above structure, reflective layer 630 is provided to the surface of ceramic phosphor 620 which is opposite the laser incident surface of ceramic phosphor 620, so that light 621 (laser light 611 and fluorescence) are reflected on reflective layer 630. It is therefore possible to increase the number of excited electrons, and emit the fluorescence to the outside. As a result, decrease of light-extraction efficiency can be suppressed.

Furthermore, since light 621 is reflected on reflective layer 630, an adhesive member such as resin that absorbs light can be provided to the surface of reflective layer 630 which is opposite the surface facing ceramic phosphor 620. As a result, ceramic phosphor 620 can be fixed to heat sink 640.

It is also possible that reflective layer 630 covers fine, uneven texture 622 on the surface of ceramic phosphor 620. It is therefore possible to prevent air between ceramic phosphor 620 and heat sink 640. As a result, thermal conductive properties can be improved.

Furthermore, for example, reflective layer 630 is an evaporated metal film.

This structure in which reflective layer 630 is an evaporated metal film can appropriately cover texture 622 of the surface of ceramic phosphor 620. As a result, thermal conductive properties can be improved.

Furthermore, by providing reflective layer 630, which is an evaporated metal film, to ceramic phosphor 620, it is possible to increase a strength of the ceramic substrate (ceramic phosphor 620 and reflective layer 630) and fix the ceramic substrate firmly to heat sink 640 or the like. Furthermore, the increase in strength of the ceramic substrate makes the ceramic substrate be unlikely to be broken. As a result, it is possible to easily handle the ceramic substrate.

In addition, it is possible to distinguish between the front side and the rear side of the ceramic substrate. As a result, an assembly workability can be improved. In particular, the above structure is useful when anti-reflective (AR) coating, anti-oxidation or moisture-resistant coating, or the like is applied to the surface of ceramic phosphor 620.

Furthermore, for example, reflective layer 630 comprises a thermal conductive material.

As a result, heat generated in ceramic phosphor 620 can be efficiently conducted via reflective layer 630 to heat sink 640.

Furthermore, for example, light emitting device 601 further includes heat sink 640 and adhesion layer 650 that comprises a thermal conductive material and causes reflective layer 630 and heat sink 640 to adhere to each other.

As a result, heat generated in ceramic phosphor 620 can be efficiently conducted via reflective layer 630 and adhesion layer 650 and eventually to heat sink 640.

It should be noted that light emitting device 601 according to the present embodiment is not necessarily provided with adhesion layer 650. Even in this case, since the lower surface of reflective layer 630 is flat, an area in which reflective layer 630 is in contact with placement surface 641 of heat sink 640 is increased in comparison with the structure without having reflective layer 630. As a result, thermal conductive properties can be improved.

[Other Variations]

Although it has been described in Embodiment 4 that, for example, ceramic phosphor 620 is formed by sintering ceramic particles generated by mixing phosphors, the present disclosure is not limited to this example. For example, ceramic phosphor 620 may be manufactured by thin-film forming of ceramic.

Furthermore, for example, although it has been described as an example in Embodiment 4 that laser light 611 is irradiated from one of the two principal surfaces of ceramic phosphor 620, it is also possible to emit laser light 611 from an end surface of ceramic phosphor 620.

Embodiment 5

Subsequently, a light emitting device according to Embodiment 5 is described.

The light emitting devices according to above-described Japanese unexamined patent application publications Nos. 2012-54272 and 2013-12358 have a problem of failing to sufficiently increase heat dissipating properties. Furthermore, the conventional light emitting devices have a problem of a difficulty in optical control, for example, in condensing fluorescence.

In order to address the above, an object of the present embodiment is to provide a light emitting device capable of achieving both good heat dissipating properties and optical control.

In order to achieve the above object, according to an aspect of the present disclosure, there is provided a light emitting device including a ceramic phosphor that is excited by laser. The ceramic phosphor has a plate-shaped ceramic structure, and includes: a emission part that includes a phosphor that is excited by laser; and a reflective part that is arranged to surround the emission part and reflects light emitted from the emission part.

According to the present disclosure, both good heat dissipating properties and optical control can be achieved.

[Light Emitting Device]

Figure 11:
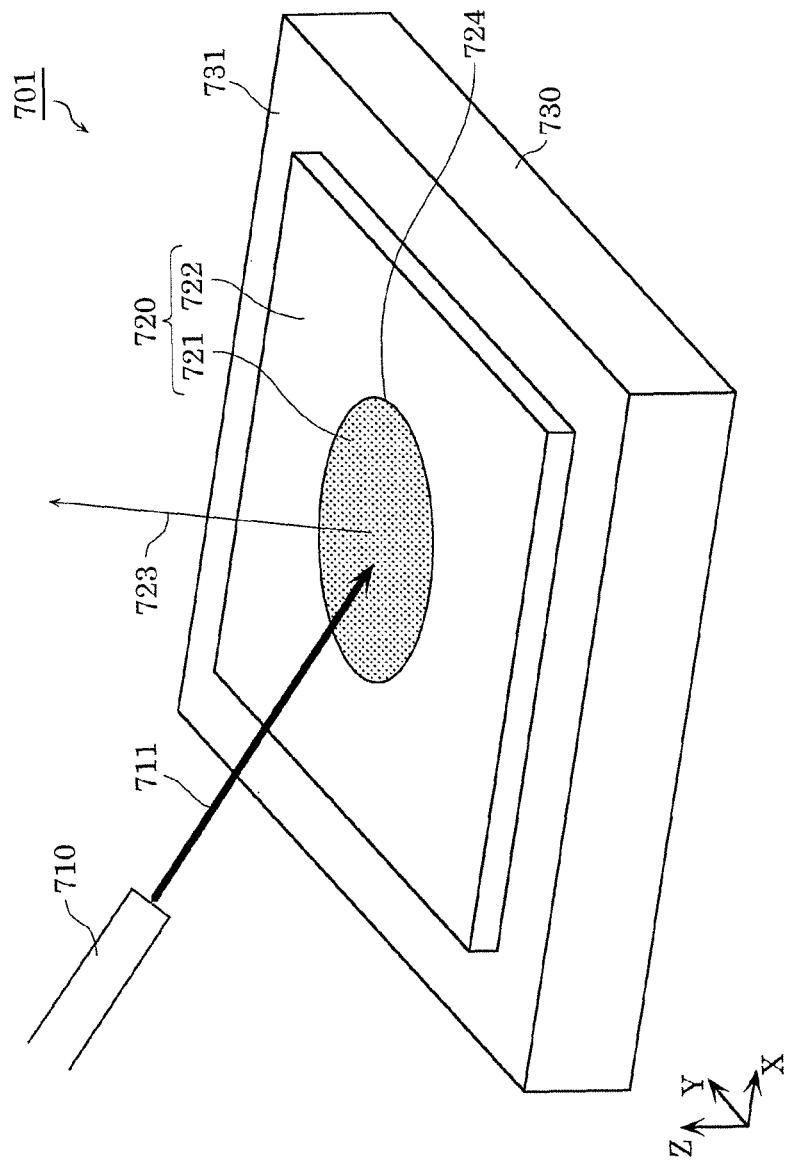
FIG. 11 is a schematic perspective view of a light emitting device according to Embodiment 5.
Figure 12:
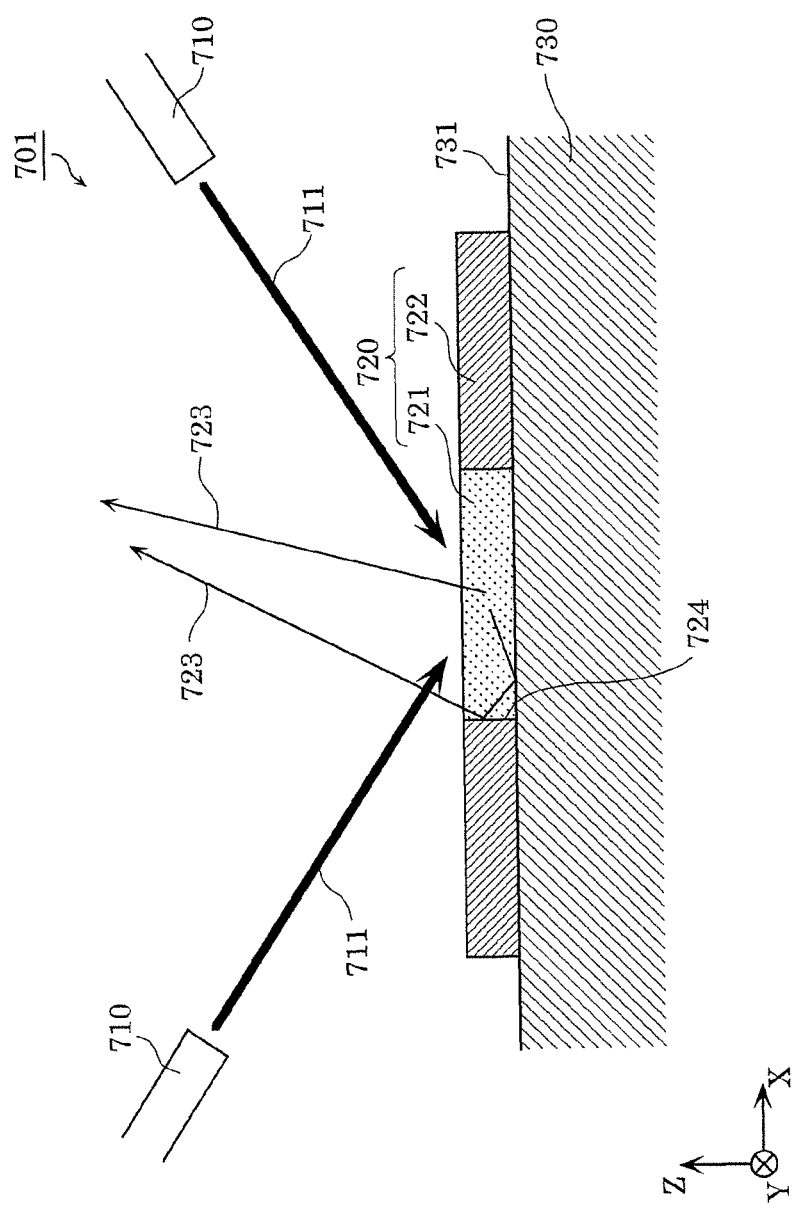
FIG. 12 is a cross-sectional view of the light emitting device according to Embodiment 5.

First, a light emitting device according to the present embodiment is described with reference to FIGS. 11 and 12. FIG. 11 is a schematic perspective view of light emitting device 701 according to the present embodiment. FIG. 12 is a cross-sectional view of light emitting device 701 according to the present embodiment.

Referring to FIGS. 11 and 12, light emitting device 701 includes laser light source 710, ceramic phosphor 720, and heat sink 730. Ceramic phosphor 720 includes emission part 721 and reflective part 722.

When laser light source 710 emits laser light 711 to emission part 721 of ceramic phosphor 720, emission part 721 emits light 723. Ceramic phosphor 720 is placed on placement surface 731 of heat sink 730 and fixed to placement surface 731.

In each of FIGS. 11 and 12, a normal direction of placement surface 731 of heat sink 730 is expressed as a Z-axis direction, and two directions parallel to the normal direction and perpendicular to each other are expressed as an X-axis direction and a Y-axis direction. In short, placement surface 731 is in parallel to an XY plane.

The following describes each of structural elements in light emitting device 701 according to the present embodiment in more detail.

[Laser Light Source]

Laser light source 710 is, for example, a semiconductor laser or an LED. Laser light source 710 is driven by driving current to emit laser light having a predetermined color (wavelength) towards emission part 721. More specifically, laser light source 710 emits ultraviolet light or violet or blue visible light as laser light 711. Laser light 711 is excitation light of phosphors included in ceramic phosphor 720. An irradiation intensity and a wavelength of laser light 711 are not limited as long as laser light 711 can excite electrons of the phosphor.

Although FIG. 11 illustrates single laser light source 710, it is also possible that light emitting device 701 includes a plurality of laser light sources 710 as illustrated in FIG. 12. The plurality of laser light sources 710 are arranged so as to emit laser light 711 from respective different directions to emission part 721. For example, laser light sources 710 may be arranged in a circular pattern, surrounding emission part 721.

[Ceramic Phosphor]

Ceramic phosphor 720 is a ceramic phosphor that is excited by laser, and has a plate-shaped ceramic structure. In the present embodiment, emission part 721 and reflective part 722 are included in the same layer as illustrated in FIG. 12. In other words, ceramic phosphor 720 is a single flat plate in shape, and each of emission part 721 and reflective part 722 is a plate in shape.

Referring to FIG. 11, the shape of ceramic phosphor 720 in the plan view is, for example, a rectangle. Here, in the present embodiment, "plan view" means a view from a side irradiated by laser light 711 (in other words, a view from a Z-axis positive direction). However, the shape of ceramic phosphor 720 in the plan view is not limited to a rectangle, but may be other shapes, such as a square, a circle, and an ellipse.

In the present embodiment, ceramic phosphor 720 is a flat plate in shape comprising ceramic, such as alumina (aluminum oxide ($Al_2O_3$)). However, the ceramic is not limited to alumina, but may be zirconia (zirconium oxide ($ZrO_2$)), zinc oxide (ZnO), or the like.

Ceramic phosphor 720 is formed by sintering ceramic particles. More specifically, a ceramic substance such as alumina particles, scattering substance or sintering agent (additive agent), and phosphors are mixed together, and then the resulting mixture is added with binder and hot-formed and then burned to form ceramic phosphor 720.

In this case, emission part 721 is formed by adding phosphors to a predetermined region in which emission part 721 is to be formed. For example, emission part 721 is alumina including phosphors. Emission part 21 is, for example, located in the center part of ceramic phosphor 720. The central part is, for example, a region including the center (or gravity center) of ceramic phosphor 720. Emission part 721 is, for example, a circle in shape in the plan view. However, emission part 721 may have any shapes. The shape of emission part 721 in the plan view may be other shapes, such as a square, a rectangle, and an ellipse.

The phosphors are not limited and may be any phosphors, such as yellow phosphors, red phosphors, or green phosphors, or a combination of these color phosphors. For example, YAG phosphor particles, CASN ($CaAlSiN_3$) or the like may be used as the phosphors.

When emission part 721 is irradiated by laser light 711, electrons of the phosphors are excited. When the excited electrons fall back to their ground state, light (fluorescence) is emitted. The fluorescence is partly emitted directly to a side irradiated by laser 711 (hereinafter, referred to as "light emitting side"), and partly reflected on reflective part 722 (boundary 724 between reflective part 722 and emission part 721) or placement surface 731 of heat sink 730 to be guided to the light emitting side of laser light 711.

Furthermore, light 723 emitted from emission part 721 may include fluorescence emitted by the phosphors and laser light 711 that is excitation light. In other words, light emitting device 701 may emit synthetic light of the fluorescence and laser light 711 to the outside as light 723. For example, when blue light is used as laser light 711, laser light 711 is scattered inside ceramic phosphor 721 so that part of laser light 711 is emitted from ceramic phosphor 721 as blue light without being absorbed and converted in the phosphors. Therefore, ceramic phosphor 721 is capable of emitting white light 723 that is generated from the blue light and the fluorescence (for example, yellow light) emitted from the phosphors.

Reflective part 722 is arranged to surround emission part 721, and reflects light 723 emitted from emission part 721. In the present embodiment, reflective part 722 is arranged on the periphery of ceramic phosphor 720 and has a light reflectivity. More specifically, reflective part 722 is a part of ceramic phosphor 720 which does not include phosphors. The shape of reflective part 722 in the plan view depends on the shape of ceramic phosphor 720 and the shape of emission part 721. In the present embodiment, the shape of reflective part 722 in the plan view is a loop whose outer periphery forms sides of a rectangle and inner periphery is circular.

Reflective part 722 has a high light reflectivity and a low light absorption. It should be noted that the light reflection on reflective part 722 is not limited to specular reflection but may also be diffuse reflection. The light reflectivity on reflective part 722 is, for example, 80% or higher, or preferably 90% or higher. The light absorption in reflective part 722 is, for example, 20% or lower, or preferably 10% or lower. For example, reflective part 722 is white alumina without including phosphors.

Ceramic phosphor 720 is placed on heat sink 730 and fixed to heat sink 730. For example, by pressing the outer periphery of ceramic phosphor 720, in other words, reflective part 722, ceramic phosphor 720 is fixed to heat sink 730. The method of pressing reflective part 722 is not limited. For example, it is possible to use hook-shaped nails protruding from placement surface 731 of heat sink 730 to press the upper surface of reflective part 722 (the laser incident surface on which laser light 711 is incident). It is further possible to press reflective part 722 by screwing or swaging.

This structure prevents emission part 721 from being pressed. As a result, it is possible to fix ceramic phosphor 720 without blocking emission of light 723 from emission part 721.

[Heat Sink]

Heat sink 730 is an example of a heat dissipater on which ceramic phosphor 720 is placed. Heat sink 730 is a heat dissipating member that dissipates heat generated in emission part 721 (more specifically, phosphors) in ceramic phosphor 720 to the outside (atmosphere). Therefore, heat sink 730 is preferably formed to comprise a substance with a high thermal conductivity, such as a metal. Heat sink 730 comprises, for example, aluminum die-casting including aluminum alloy. Furthermore, heat sink 730 may be, for example, provided with a plurality of heat dissipating fins (not illustrated).

Placement surface 731 of heat sink 730 is one of the surfaces of heat sink 730, and is a surface on which ceramic phosphor 720 is placed. Placement surface 731 is mirrored. For example, by polishing one of the surfaces of heat sink 730, placement surface 731 having the resulting mirrored surface is formed. This allows placement surface 731 to reflect light 723 emitted from emission part 721. As a result, light-extraction efficiency can be improved.

[Effects Etc.]

Like light emitting device 701 according to Embodiment 5, if a phosphor that is excited by laser is used, it is required to efficiently conduct heat generated in the phosphor to a heat sink. For example, by increasing an area in which the phosphor and the heat sink are in contact with each other, it is possible to efficiently conduct the heat generated in the phosphor to the heat sink.

However, if the area of the phosphor (emission part 721) is increased, an area from which light emits is also increased, so that optical control becomes difficult. The fluorescence (and laser light) caused by irradiation of laser light travels inside of the phosphor and then is emitted to the outside. The increase of the area of the phosphor increases the region through which the light travels, which eventually increases an area from which the light is emitted. Therefore, for example, a lens for collecting fluorescence increases in size, which makes optical control difficult. In order to make the optical control easy, it is preferable that light is emitted from a narrow region.

In order to address this, light emitting device 701 according to the present embodiment includes, as described previously, ceramic phosphor 720 that is excited by laser. Ceramic phosphor 720 has a plate-shaped ceramic structure and includes: emission part 721 that includes a phosphor that is excited by laser; and reflective part 722 that is provided to surround emission part 721 and reflects light 723 emitted from emission part 721. Furthermore, for example, light emitting device 701 also includes heat sink 730 on which ceramic phosphor 720 is placed.

With the above structure, the heat generated in emission part 721 surrounded by reflective part 722 travels to the end parts of ceramic phosphor 720 beyond boundary 724 between emission part 721 and reflective part 722. In other words, since both emission part 721 and reflective part 722 comprise ceramic, heat is smoothly conducted at boundary 724 between emission part 721 and reflective part 722. Therefore, the heat generated in emission part 721 spreads in a planar direction. As a result, it is possible to efficiently conduct the heat from entire ceramic phosphor 720 to heat sink 730.

On the other hand, light 723 emitted from emission part 721 is reflected on boundary 724 between emission part 721 and reflective part 722. Therefore, light 723 is emitted from emission part 721 without being spread in a plan direction. As a result, a lens can be decreased in size, and freedom of optical design is improved.

As described above, light emitting device 701 according to the present embodiment can decrease an area of emission part 721 and increase an area in which ceramic phosphor 720 and heat sink 730 are in contact with each other. As a result, good heat dissipating properties and optical control can be achieved.

Furthermore, for example, emission part 721 and reflective part 722 are included in the same layer.

This structure can decrease a thickness of ceramic phosphor 720 and reduce a size of light emitting device 701. Furthermore, since light can be reflected on boundary 724 between emission part 721 and reflective part 722, light collection properties of light 723 can be increased.

Furthermore, for example, placement surface 731, on which ceramic phosphor 720 of heat sink 730 is placed, is mirrored.

This structure allows placement surface 731 to reflect light 723 emitted from emission part 721. As a result, light-extraction efficiency can be improved.

[Variation 1]

Figure 13:
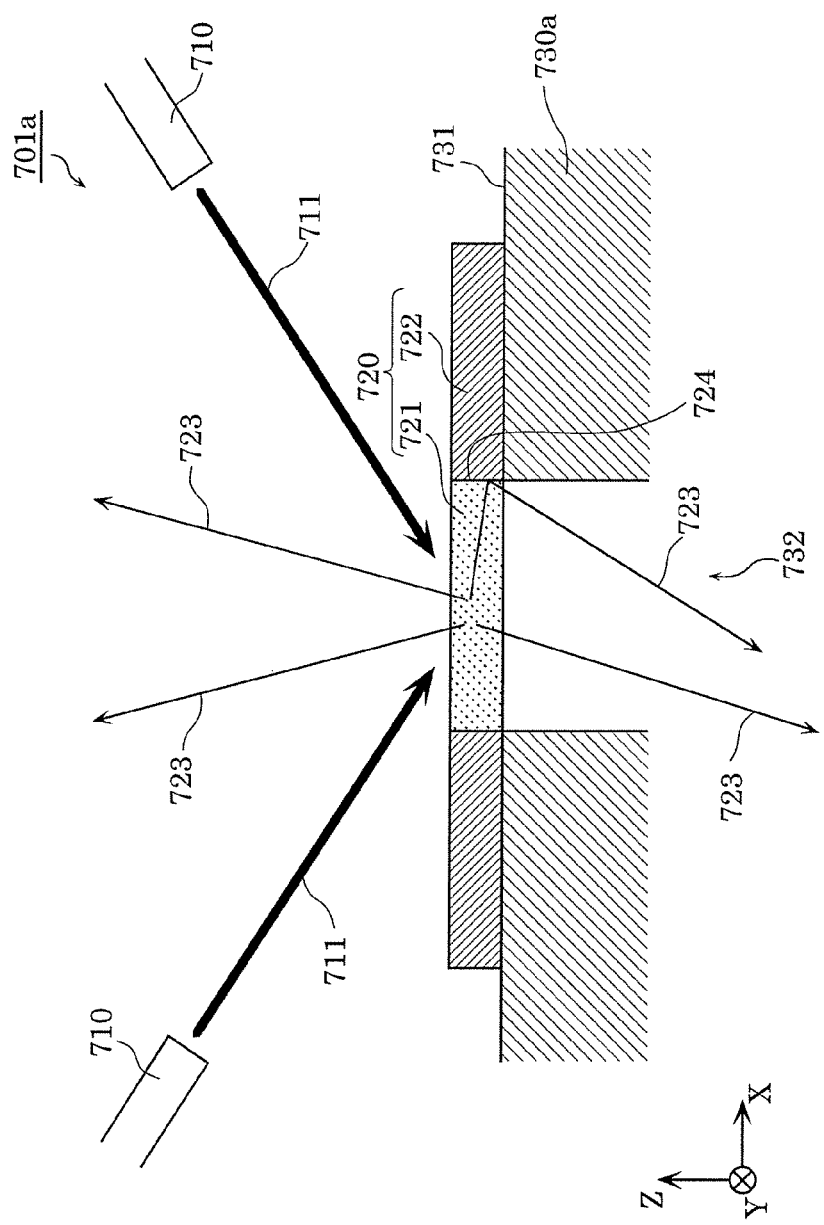
FIG. 13 is a cross-sectional view of a light emitting device according to Variation 1 of Embodiment 5.

The following describes a variation of light emitting device 701 according to Embodiment 5 with reference to FIG. 13.

It has been described in Embodiment 5 that light emitting device 701 emits light 723 towards a side irradiated by laser light 711 (in other words, in a Z-axis positive direction). However, the present disclosure is not limited to this example. For example, it is possible to emit light 723 to the side opposite the side irradiated by laser light 711 (in a Z-axis negative direction), in other words, towards heat sink 730. It is further possible to emit light 723 to both the sides.

FIG. 13 is a cross-sectional view of light emitting device 701*a* according to Variation 1 of Embodiment 5.

Referring to FIG. 13, light emitting device 701*a* differs from light emitting device 701 illustrated in FIG. 12 in that heat sink 730 is replaced by heat sink 730*a*. The following description is given mainly for differences from Embodiment 5.

Heat sink 730*a* differs from heat sink 730 in provision of through hole 732. Through hole 732 penetrates heat sink 730 in a thickness direction (Z-axis direction).

Through hole 732 is provided in the same region as emission part 721 when viewed from the thickness direction of ceramic phosphor 720 (Z-axis direction). For example, in the plan view, emission part 721 and through hole 732 have the identical shapes.

This structure allows light 723 emitted from emission part 721 to travel towards heat sink 730 via through hole 732.

[Variation 2]

Figure 14:
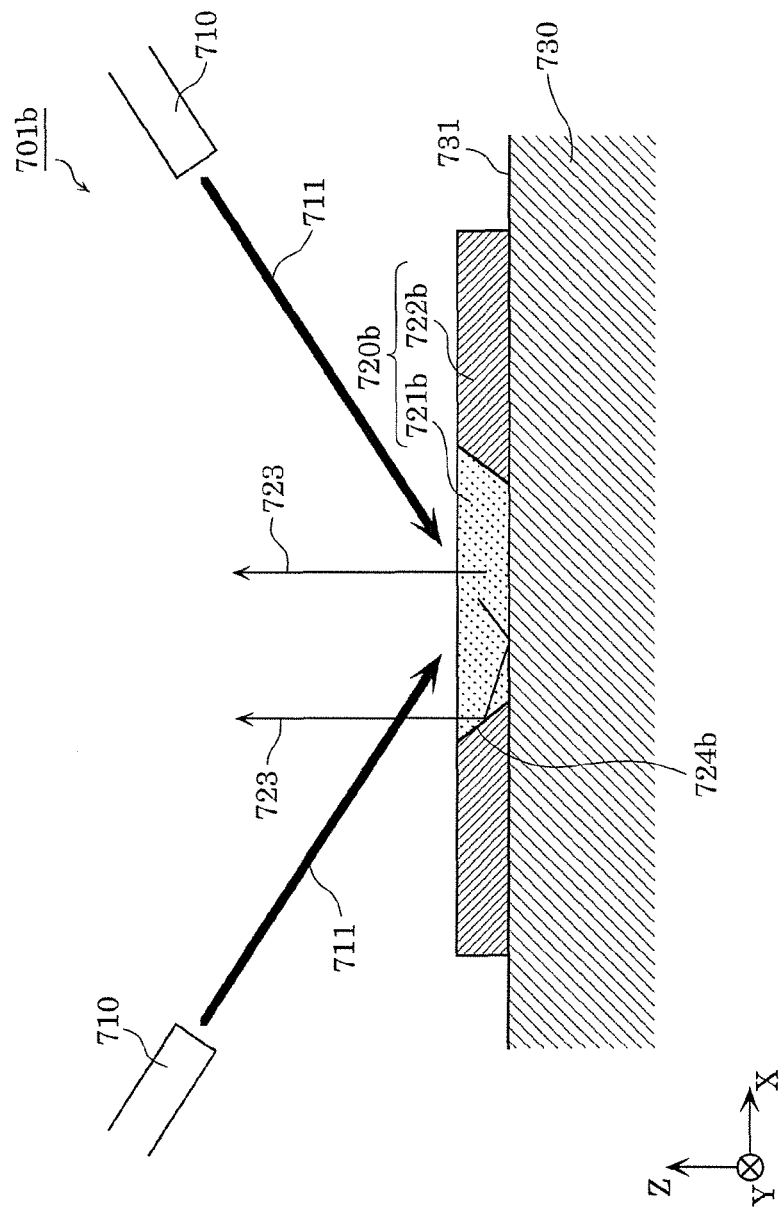
FIG. 14 is a cross-sectional view of a light emitting device according to Variation 2 of Embodiment 5.

The following describes a light emitting device according to Variation 2 of Embodiment 5 with reference to FIG. 14.

FIG. 14 is a cross-sectional view of light emitting device 701*b* according to Variation 2 of Embodiment 5.

Referring to FIG. 14, light emitting device 701*b* differs from light emitting device 701 illustrated in FIG. 12 in that ceramic phosphor 720 is replaced by ceramic phosphor 720*b*. Ceramic phosphor 720*b* includes emission part 721*b* and reflective part 722*b*.

Although emission part 721*b* and reflective part 722*b* have the same functions as those of emission part 721 and reflective part 722 according to Embodiment 5, respectively, the boundary between emission part 721*b* and reflective part 722*b* is different from the boundary between emission part 721 and reflective part 722. More specifically, boundary 724*b* between emission part 721*b* and reflective part 722*b* inclines with respect to a thickness direction of ceramic phosphor 720*b* (Z-axis direction). The inclination is any desired angle.

By adjusting the inclined angle in manufacturing ceramic phosphor 720*b*, it is possible to collect light 723. In other words, desired light distribution can be achieved.

Others

Thus, although the light emitting device according to the present disclosure has been described based on Embodiments 4 and 5 and Variations 1 and 2 of Embodiment 5, the present disclosure is not limited to the embodiments and variations.

For example, it has been described in Embodiments 4 and 5 that light emitting devices 601 and 701 include laser light sources 610 and 710, respectively. However, light emitting devices 601 and 701 do not necessarily include laser light sources 610 and 710, respectively. For example, ceramic phosphor 620 or 720 may emit light 621 or 723, by laser light emitted from a different laser light source.

Although, for example, it has been described in Embodiments 4 and 5 that light emitting devices 601 and 701 include heat sinks 640 and 730, respectively, light emitting devices 601 and 701 do not necessarily include a heat dissipater, such as heat sinks 640 and 730, respectively. For example, each of ceramic phosphors 620 and 720 may be placed on a member that is not a heat dissipater, or held by a holding member, such as a clip. Even if heat sink 640 is not provided, reflective layer 630 can reflect light 621, thereby increasing a light-extraction efficiency. Even if heat sink 730 is not provided, heat generated in emission part 721 spreads in entire ceramic phosphor 720. Therefore, for example, an area in contact with air (atmosphere) is increased to increase heat dissipating properties.

Although it has been described in Embodiments 4 and 5 that, for example, ceramic particles which are mixed with phosphors in a predetermined region are sintered to form ceramic phosphor 720, the present disclosure is not limited to this example. For example, ceramic phosphor 720 may be formed by thin-film forming of ceramic. For example, it is possible to grow ceramic directly from placement surface 731 of heat sink 730 to form ceramic phosphor 720. In other words, ceramic phosphor 720 and heat sink 730 may be integrated.

Furthermore, for example, although it has been described in Embodiments 4 and 5 that each of ceramic phosphors 620 and 720 is a single flat plate in shape, the shapes of the ceramic phosphors are not limited to this example. For example, ceramic phosphor 720 may include reflective part 722 that is a flat plate in shape, and emission part 721 that is provided on a principal surface of reflective part 722. In other words, reflective part 722 and emission part 721 may be stacked. Moreover, the shape of each of ceramic phosphors 620 and 720 is not limited to the flat plate (substantially cuboid with flat surfaces), but may be a polyhedron that looks a chipped flat plate.

For example, although it has been described in Embodiments 4 and 5 that the center part of ceramic phosphor 720 is provided with emission part 721, the present disclosure is not limited to this example. For example, emission part 721 may be provided in a region not including the center of ceramic phosphor 720. Furthermore, the number of provided emission part 721 is not limited to one. A plurality of emission parts 721 may be provided to ceramic phosphor 720.

Furthermore, for example, it is possible to provide a reflective layer on a lower surface of ceramic phosphor 720 (a surface in contact with heat sink 730). More specifically, the reflective layer may be in contact with the lower surface of ceramic phosphor 720, and be, for example, an evaporated metal film comprising aluminum, silver, or the like. The reflective layer is not limited to a metal, but may be other thermal conductive materials (TIM).

It is also possible to provide an adhesion layer comprising a thermal conductive material between the reflective layer and heat sink 730 (placement surface 731) to adhere the reflective layer and heat sink 730 to each other. The adhesion layer is, for example, solder, silver paste, or the like.

Each of light emitting devices 601, 701, 701a, and 710b may be applicable to various light emitting devices, such as illumination apparatuses, projectors, and laser pointers.

The present disclosure is not limited to the above-described embodiments and variations. While the foregoing has described what are considered to be the best mode and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A wavelength conversion member comprising:
    a substrate;
    a reflective layer above the substrate, the reflective layer reflecting at least part of light incident from above;
    an amorphous layer above the reflective layer, the amorphous layer transmitting light;
    a metal oxide layer above the amorphous layer, the metal oxide layer transmitting light; and
    a phosphor layer on the metal oxide layer, the phosphor layer including a plurality of phosphors, wherein
    gaps between the plurality of phosphors within the phosphor layer are filled with a metal oxide of the metal oxide layer such that phosphors of the plurality of phosphors are provided within the metal oxide that fills the gaps.

2. The wavelength conversion member according to claim 1,
    wherein the reflective layer is a dichroic mirror layer.

3. The wavelength conversion member according to claim 2,
    wherein the dichroic mirror layer includes a low refractive layer and a high refractive layer, and
    the amorphous layer has a thickness greater than or equal to a thickness of the low refractive layer.

4. The wavelength conversion member according to claim 1,
    wherein the reflective layer is a metal reflective layer.

5. The wavelength conversion member according to claim 4,
    wherein the metal reflective layer includes a reflection enhancing layer that includes a low refractive layer and a high refractive layer, and
    the amorphous layer has a thickness greater than or equal to a thickness of the low refractive layer.

6. The wavelength conversion member according to claim 4,
    wherein the metal reflective layer includes a reflective layer comprising aluminum.

7. The wavelength conversion member according to claim 1,
    wherein the amorphous layer comprises either one of $SiO_2$ and $TiO_2$.

8. The wavelength conversion member according to claim 1,
    wherein the metal oxide layer comprises ZnO.

9. The wavelength conversion member according to claim 3,
    wherein the low refractive layer comprises either one of $SiO_2$ and $Al_2O_3$, and the high refractive layer comprises either one of $TiO_2$ and $Nb_2O_3$.

10. The wavelength conversion member according to claim 1,
wherein the substrate is either one of a sapphire substrate and a silicon substrate.

11. A light emitting device comprising:
the wavelength conversion member according to claim 1; and
an irradiator configured to irradiate the wavelength conversion member with light that excites the plurality of phosphors.

12. A projector comprising:
the light emitting device according to claim 11.

13. A method of manufacturing a wavelength conversion member, the method comprising:
forming a reflective layer above a substrate, the reflective layer reflecting at least part of light incident from above;
forming an amorphous layer above the reflective layer, the amorphous layer transmitting light;
forming a metal oxide layer above the amorphous layer, the metal oxide layer transmitting light;
depositing a plurality of phosphors on the metal oxide layer; and
forming a phosphor layer including a metal oxide between the plurality of phosphors by crystal growth of the metal oxide layer, and
the metal oxide in the phosphor and a metal oxide in the metal oxide layer are the same.

* * * * *